(12) United States Patent
Iwasaki

(10) Patent No.: US 7,248,757 B2
(45) Date of Patent: Jul. 24, 2007

(54) METHOD, DEVICE AND COMPUTER PROGRAM FOR DESIGNING A CIRCUIT HAVING ELECTRIC WIRES AND OPTICAL CONNECTIONS

(75) Inventor: Tatsuya Iwasaki, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/010,381

(22) Filed: Dec. 14, 2004

(65) Prior Publication Data

US 2005/0129348 A1 Jun. 16, 2005

(30) Foreign Application Priority Data

Dec. 15, 2003 (JP) ............................. 2003-415823
Dec. 15, 2003 (JP) ............................. 2003-415826

(51) Int. Cl.
G02F 6/12 (2006.01)
G02B 6/10 (2006.01)
H01L 31/232 (2006.01)
G02B 6/12 (2006.01)

(52) U.S. Cl. ...................... 385/14; 385/131; 257/432
(58) Field of Classification Search ............... 385/14
See application file for complete search history.

(56) References Cited

U.S. PATENT DOCUMENTS

| | | | | |
|---|---|---|---|---|
| 5,914,889 A | * | 6/1999 | Cohen et al. .................. 716/8 |
| 5,930,150 A | * | 7/1999 | Cohen et al. ................. 716/11 |
| 6,023,755 A | * | 2/2000 | Casselman .................... 712/37 |
| 6,278,231 B1 | | 8/2001 | Iwasaki et al. .............. 313/310 |
| 6,543,041 B1 | * | 4/2003 | Scheffer et al. .............. 716/10 |
| 6,560,760 B1 | | 5/2003 | Nagai ............................ 716/9 |
| 6,838,297 B2 | | 1/2005 | Iwasaki et al. .............. 438/20 |
| 6,845,184 B1 | * | 1/2005 | Yoshimura et al. .......... 385/14 |
| 6,897,430 B2 | * | 5/2005 | Uchida ..................... 250/214.1 |
| 6,936,808 B2 | * | 8/2005 | Uchida ..................... 250/214.1 |
| 6,995,443 B2 | * | 2/2006 | Geusic et al. ............... 257/432 |
| 7,062,117 B2 | * | 6/2006 | Uchida ......................... 385/14 |
| 7,072,535 B2 | * | 7/2006 | Uchida ......................... 385/14 |
| 7,141,778 B2 | * | 11/2006 | Uchida .................... 250/214 R |
| 2002/0167013 A1 | * | 11/2002 | Iwasaki et al. ............... 257/79 |
| 2004/0258348 A1 | * | 12/2004 | Deliwala ...................... 385/14 |
| 2005/0289490 A1 | * | 12/2005 | Shastri et al. .................. 716/4 |
| 2006/0056756 A1 | * | 3/2006 | Uchida ......................... 385/14 |
| 2006/0120668 A1 | * | 6/2006 | Iwasaki ........................ 385/47 |
| 2006/0159386 A1 | * | 7/2006 | Iwasaki ........................ 385/14 |

FOREIGN PATENT DOCUMENTS

| | | |
|---|---|---|
| JP | 6-308519 | 11/1994 |
| JP | 2000-311156 | 11/2000 |
| JP | 2001-298086 | 10/2001 |

OTHER PUBLICATIONS

U.S. Appl. No. 10/530,188 (Iwasaki), filed Apr. 4, 2005.
U.S. Appl. No. 10/533,564 (Iwasaki), filed Jun. 3, 2005.

* cited by examiner

Primary Examiner—Michelle Connelly-Cushwa
Assistant Examiner—Rhonda S. Peace
(74) Attorney, Agent, or Firm—Fitzpatrick, Cella, Harper & Scinto.

(57) ABSTRACT

A design method and a design device can design an optimal optoelectronic circuit in a relatively short period of time by exploiting the performance of hardware. They have a step of generating a connection list to be carried by electric circuits (electric nets) and a connection list to be carried by optical connections (optical nets), a step of designing the layout of electric circuits and subsequently designing optical connections and a step of evaluating the designs.

16 Claims, 21 Drawing Sheets

Fan-out
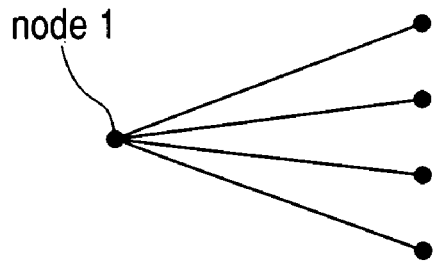
FIG. 3A
NET LIST (NUMBER OF NET: 4)
node 1 → node 2
node 1 → node 3
node 1 → node 4
node 1 → node 5
FIG. 3B
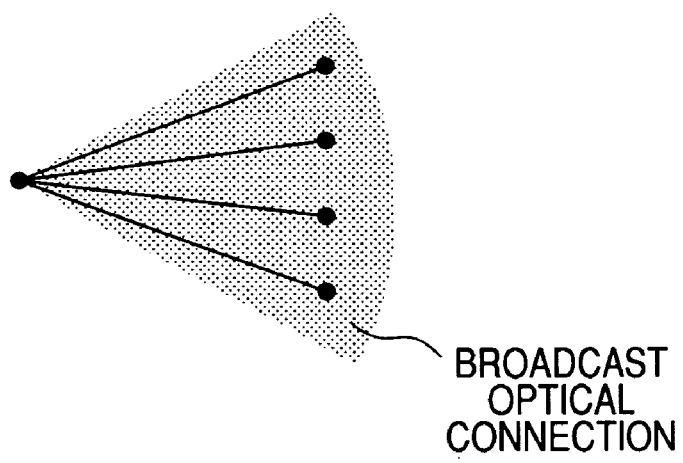
OPTICAL NET USING BROADCAST (NUMBER OF NET: 1)
port 1 → port 2, port 3, port 4, port 5

Fan-out PARALLEL CONNECTION

DESIGNED BY USING ONLY ELECTRONIC CIRCUITS

APPLICATION OF OPTICAL CONNECTIONS

PLACEMENT ALTERATION AND REDESIGN OF ELECTRIC CIRCUITS

METHOD, DEVICE AND COMPUTER PROGRAM FOR DESIGNING A CIRCUIT HAVING ELECTRIC WIRES AND OPTICAL CONNECTIONS

BACKGROUND OF THE INVENTION

1. Field of the Invention

This invention relates to a method, a device and a computer program for designing a circuit having both electronic circuits connected by electric wires and optical circuits using optical connections as integral components thereof (to be also referred to as optoelectronic circuit).

2. Related Background Art

Recently, information processing devices including personal computers, mobile phones and personal digital assistants (PDAs) have been required to operate at high processing speed in addition to be compact and lightweight. However, as the processing speed rises, problems arise to the circuits thereof, including wiring delays, EMI (electromagnetic interference) noises and so on. Techniques have been proposed to utilize optical circuits using optical connections in order to avoid wiring delays, EMI noises and other problems (see, inter alia, Japanese Patent Application Laid-Open No. H6-308519).

Meanwhile, information processing devices and robot controllers are required to be capable of switching a plurality of control algorithms on a real time basis for the control operation. From this point of view, there is a demand for reconfigurable circuits that can operate at high speed and switch configuration on a real time basis. Examples of reconfigurable circuits include FPGAs (field programmable gate arrays) and CPLDs (complex programmable logic devices) (see, inter alia, Patent Application Laid-Open Publication No. 2000-311156). However, such circuits need further improvements in terms of high speed operation and circuit size.

FIG. 20 of the accompanying drawings is a flow chart that can generally be employed when designing an information processing device (semiconductor system) of the type under consideration. Generally, a system design is carried out according to a requirement specification and subsequently a circuit connection list (net list) is generated by way of a logical design. Then, the layout (place and route design) of the system is designed and verified. A design method using such a technique for a system having two chips is known (Japanese Patent Application Laid-Open No. 2001-298086). According to the design method, when one or more than one problems are detected as a result of verification, the redesign process goes back to the place and route design or to the system design.

Thus, to realize a sophisticated information processing device or a controller, circuits are required to be of a large scale, operable at high speed and flexible (reconfigurable). The use of a circuit having both electronic circuits connected by electric wires and optical circuits using optical connections as integral components thereof, or an optoelectronic circuit, can meet such requirements.

When designing a system having both optical circuits using optical fibers and optical waveguides and electronic circuits coexist as integral parts thereof, the optical circuits and the electronic circuits are clearly separated from each other and designed independently as shown in FIG. 21 in the initial stages of the system design shown in FIG. 20. However, with such a design technique of designing optical circuits and electronic circuits separately, it is difficult to fully exploit the potentials of the circuits (hardware) of the two categories. To be more accurately, while optical circuits and electronic circuits may be designed optimally, the design of the optoelectronic circuit for integrally combining them is not optimal. Additionally, designing an optoelectronic circuit requires advanced professional knowledge of circuits of the two categories, a vast amount of time and huge cost.

SUMMARY OF THE INVENTION

In view of the above identified problems, according to the invention, there is provided a method of designing a circuit (optoelectronic circuit) having electric wires and optical connections, said method comprising at least: a first step of generating a circuit connection list (net list); a second step of generating a list of connections to be carried by electronic circuits (electric nets) and a list of connections to be carried by optical connections (optical nets) from the circuit connection list; a third step of designing placements of parts and wires according to the electric nets; and a fourth step of designing optical connections according to the optical nets; for the purpose of optimizing the design.

Preferably, a fifth step of placing optical ports that are parts having a photoelectric conversion feature is provided after said second step and before said third and fourth steps. Thus, it is possible to optimize the optoelectronic circuit as a whole in addition to optimally designing optical circuits and electronic circuits by carrying out a place and route design with priority for optical ports that operate as interfaces of optical circuits and electronic circuits.

Preferably, in said second step, the electric nets and the optical nets are generated so as to minimize the number of electric nets. Preferably, in said fifth step, the optical ports are placed so as to minimize the total length of electric wires. Preferably, a method of designing a circuit according to the invention may further comprise a sixth step of verifying the design of placements of parts and wires in said third step and the design of optical connections in said fourth step and determining either to end the design operation or to return to one of said second through fourth steps.

Preferably, said optoelectronic circuit has a package structure including a plurality of semiconductor chips, an electric wiring layer and an optical connection layer and at least part of the interconnections of the semiconductor chips is realized optically by way of the optical connection layer. With such an arrangement, said optical connection layer may have two-dimensional optical waveguides and optical ports for inputting optical signals from and outputting optical signals to the two-dimensional optical waveguides so that it is possible to optically interconnect combinations of any of the optical ports. Preferably, said semiconductor chips have reconfigurable circuits so that it is possible to alter the internal configurations of the semiconductor chips and additionally alter the optical connections among the semiconductor chips by way of said optical connection layer.

In view of the above identified problems, according to the present invention, there is provided a device for designing an optoelectronic circuit, said device comprising at least: a first means for generating an electronic circuit connection list and an optical connection list from a circuit connection list; a second means for storing the circuit connection list, the electronic circuit connection list and the optical connection list; a third means for designing a layout for electronic circuits according to the electronic circuit connection list; and a fourth means for designing optical connections according to the optical connection list.

A device for designing an optoelectronic circuit according to the invention may further comprise a fifth means for arranging optical ports, or parts having a photoelectric conversion feature, a sixth means for verifying the design of placements of parts and wires by said third means and that of optical connections by said fourth means and determining either to end the design operation or not and a control means for controlling the sequence of operations of said first through sixth means. With such a design device, it is possible to conduct a design method according to the invention reliably and appropriately.

In view of the above-identified problems, according to the invention, there is provided a computer program for designing an optoelectronic circuit, said program being adapted to drive a computer so as to execute at least: a first step of generating an electronic circuit connection list and an optical connection list from a circuit connection list; a second step of designing a layout for electronic circuits according to the electronic circuit connection list; and a third step of designing optical connections according to the optical connection list.

A computer program for designing an optoelectronic circuit according to the invention may further comprise a fourth step of driving a computer so as to execute an operation of placing optical ports that are parts having a photoelectric conversion feature after said first step and before said second and third steps and/or a branching step of driving a computer so as to verify the design and select the next step according to the result of the verification. Thus, a design method according to the invention can be reliably conducted by installing such a design computer program in a computer along with net lists and evaluation guidelines.

In view of the above-identified problems, an optoelectronic circuit designed according to the invention has a plurality of electronic circuits, a plurality of electric wiring sections and a plurality of optical connecting sections to show a configuration that can be designed by a design method as defined above or designed by a design method according to the invention. In other words, such an optoelectronic circuit allows a design method according to the invention to be conducted reliably.

In view of the above-identified problems, according to the invention, there is provided a device for reconfiguring an optoelectronic circuit. The device comprises a device for designing an optoelectronic circuit according to the invention and an input/output means and is adapted to design an optoelectronic circuit according to the information input from the input/output means and install the outcome of the design operation in a reconfigurable optoelectronic circuit. Such a device for reconfiguring an optoelectronic circuit can be so adapted to process the information to be processed that is input from said input/output means by means of a reconfigurable optoelectronic circuit in which said outcome of the design operation is installed. Such a device for reconfiguring an optoelectronic circuit can be realized by applying a design device according to the invention and can by turn realize an optoelectronic reconfigurable system such as an optoelectronic system that can be reconfigured on a real time basis.

In view of the above identified problems, according to the invention, there is provided a method of reconfiguring an optoelectronic circuit adapted to use a reconfigurable optoelectronic circuit and a device for designing an optoelectronic circuit as described above, perform a design operation by means of the design device according to the input information and install the outcome of the design operation in the reconfigurable circuit. Such a reconfiguring method can be realized by applying a design apparatus and an optoelectronic circuit according to the invention and corresponds to an above-described optoelectronic reconfigurable system.

In view of the above identified problems, according to the invention, there is provided a design evaluation device comprising a device for designing an optoelectronic circuit and an evaluation means adapted to install the outcome of the design device in a reconfigurable optoelectronic circuit, operate it and evaluate the outcome of the design operation. Such a design evaluation device can also be realized by applying a design device according to the invention and is adapted to design an optoelectronic circuit by using a reconfigurable optoelectronic circuit as emulator.

In view of the above identified problems, according to the invention, there is provided a method of evaluating a design of an optoelectronic circuit adapted to use a reconfigurable optoelectronic circuit and a device for designing an optoelectronic circuit as described above, install the outcome of the design device in a reconfigurable optoelectronic circuit, operate it and evaluate the outcome of the design operation. Such a design evaluation method can also be realized by applying a design device and an optoelectronic circuit according to the invention and corresponds to an above-described design evaluation device.

In view of the above identified problems, according to the invention, there is provided a method of designing a circuit having electric wires and optical connections (optoelectronic circuit), said method comprising at least: a first step of generating a circuit connection list (net list); a second step of designing a layout for electronic circuits according to the circuit connection list; a third step of generating an optical connection list constituted by a part of the circuit connection list (optical nets) to be carried by optical connections and an electronic circuit connection list constituted by the remaining part of the circuit connection list (electric nets) to be carried by electronic circuits; a fourth step of designing optical connections according to the optical connection list; a fifth step of designing an layout of electronic circuits according to the electronic circuit connection list; and a sixth step of performing a design evaluation of the layout design of electronic circuits of said second step or a design evaluation of the design of said fourth step and the design of said fifth step and determining either to proceed to said third step or end the design.

Preferably, said third, fourth, fifth and sixth steps are repeated for more than once. By repeating the steps, it is possible to optimize the arrangement of devices, electric wirings and the configuration of optical connections in the entire optoelectronic circuit as well as optimize the arrangement of each of optical and electronic circuits. Additionally, with this design method, it is possible to comprehensively design a highly optimized optoelectronic circuit as the design of electronic circuits and that of optical circuits are integrated in a coordinated manner.

Preferably, in a method of designing an optoelectronic circuit, new electronic circuits are added to the connecting sections of the optical connections and the electronic circuits and a connection list corresponding to the new electronic circuits is added to the electronic circuit connection list in the fourth step. Said optoelectronic circuit has a package structure including a plurality of semiconductor chips, an electric wiring layer and an optical connection layer and at least part of the interconnections of the semiconductor chips is realized optically by way of the optical connection layer. With such an arrangement, said optical connection layer may have two-dimensional optical waveguides and optical ports for inputting optical signals from and outputting optical signals to the two-dimensional optical waveguides so that it is possible to optically interconnect combinations of any of the optical ports. Preferably, said semiconductor chips have reconfigurable circuits so that it is possible to alter the internal configurations of the semiconductor chips and additionally alter the optical connections among the semiconductor chips by way of said optical connection layer.

In view of the above identified problems, according to the invention, there is provided a device for designing an optoelectronic circuit, said device comprising at least: a first means for storing a circuit connection list; a second means for designing a layout for electronic circuits according to the circuit connection list; a third means for generating an optical connection list constituted by a part of the circuit connection list and an electronic circuit connection list constituted by the remaining part of the circuit connection list; a fourth means for designing optical connections according to the optical connection list; a fifth means for evaluating the layout design of electronic circuits by said second means and the design by said fourth means; and a control means for controlling the sequence of operations of said first through fifth means. A design device as described above can conduct a design method according to the invention reliably and appropriately.

In view of the above-identified problems, according to the invention, there is provided a computer program for designing an optoelectronic circuit, said program being adapted to drive a computer so as to execute at least: a step of designing a layout for electronic circuits according to a circuit connection list; a branching step of evaluating the design and selecting the next step to be carried out according to the outcome of the design evaluation; a step of generating an optical connection list constituted by a part of the circuit connection list and an electronic circuit connection list constituted by the remaining part of the circuit connection list; and a step of designing optical connections according to an optical connection list. A design method according to the invention as described above can be conducted reliably and appropriately by installing a design computer program as defined above in a computer along with data including a net list and evaluation guidelines.

In view of the above identified problems, an optoelectronic circuit according to the invention has a plurality of electronic circuits, an electric wiring section and an optically connecting section to show a configuration that can be designed or is designed by a design method according to the invention as defined above.

In view of the above-identified problems, according to the invention, there is provided a device for reconfiguring an optoelectronic circuit. The device comprises a device for designing an optoelectronic circuit according to the invention and an input/output means and is adapted to design an optoelectronic circuit according to the information input from the input/output means and install the outcome of the design operation in a reconfigurable optoelectronic circuit. Such a device for reconfiguring an optoelectronic circuit can be so adapted to process the information to be processed that is input from said input/output means by means of a reconfigurable optoelectronic circuit in which said outcome of the design operation is installed. Such a device for reconfiguring an optoelectronic circuit can be realized by applying a design device according to the invention and can by turn realize an optoelectronic reconfigurable system such as an optoelectronic system that can be reconfigured on a real time basis.

In view of the above-identified problems, according to the invention, there is provided a method of reconfiguring an optoelectronic circuit adapted to use a reconfigurable optoelectronic circuit and a device for designing an optoelectronic circuit as described above, perform a design operation by means of the design device according to the input information and install the outcome of the design operation in the reconfigurable circuit. Such a reconfiguring method can be realized by applying a design apparatus and an optoelectronic circuit according to the invention and corresponds to an above-described optoelectronic reconfigurable system.

In view of the above identified problems, according to the invention, there is provided a design evaluation device comprising a device for designing an optoelectronic circuit and an evaluation means adapted to install the outcome of the design device in a reconfigurable optoelectronic circuit, operate it and evaluate the outcome of the design operation. Such a design evaluation device can also be realized by applying a design device according to the invention and is adapted to design an optoelectronic circuit by using a reconfigurable optoelectronic circuit as emulator.

In view of the above identified problems, according to the invention, there is provided a method of evaluating a design of an optoelectronic circuit adapted to use a reconfigurable optoelectronic circuit and a device for designing an optoelectronic circuit as described above, install the outcome of the design device in a reconfigurable optoelectronic circuit, operate it and evaluate the outcome of the design operation. Such a design evaluation method can also be realized by applying a design device and an optoelectronic circuit according to the invention and corresponds to an above-described design evaluation device.

Thus, a design method and a design device according to the invention can fully exploit the potentials of hardware and design an optimum optoelectronic circuit highly reliably in a short period of time. Since a design method according to the invention integrally combines an operation of designing electronic circuits and that of designing optical circuits, electronic circuits and optical circuits are designed in a coordinated manner and hence a highly optimized optoelectronic circuit is designed as a whole. As a result, it is possible to ultimately provide a high cost performance effect for the designed optoelectronic circuit. Additionally, a design method according to the invention can be applied to an operation of automatically designing a reconfigurable optoelectronic circuit.

Particularly, it is possible to realize an optoelectronic circuit in which optical circuits and electronic circuits are designed in a highly coordinated manner by generating electric nets and optical nets so as to minimize the number of electric nets in the second step and placing optical ports so as to minimize the total length of electric wires in the third step.

BRIEF DESCRIPTION OF THE DRAWINGS

FIGS. 3A and 3B are a schematic illustration of a fan-out connection net list and corresponding broadcast optical connections;

DESCRIPTION OF THE PREFERRED EMBODIMENTS

Figure 1:
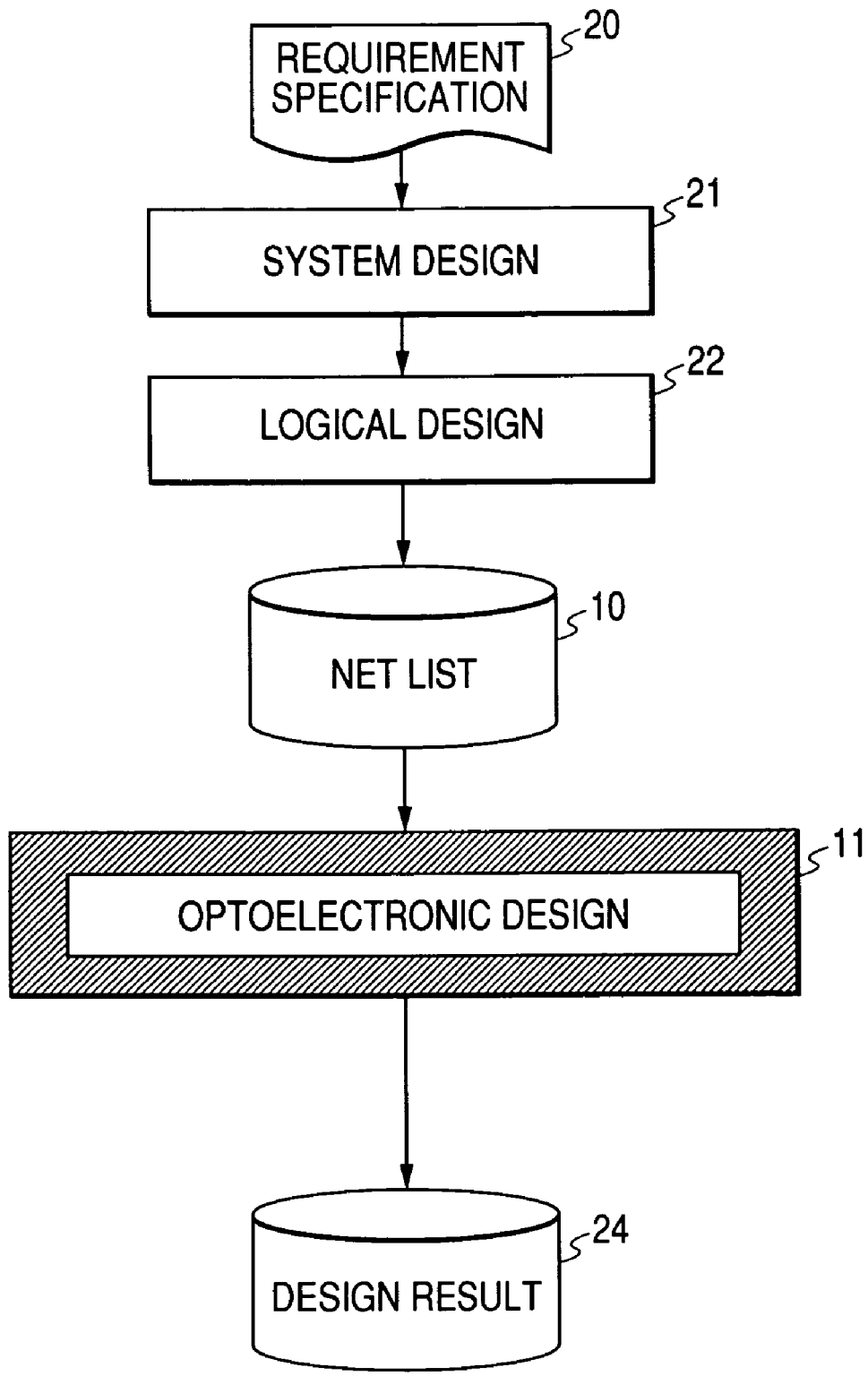
FIG. 1 is a flow chart for designing an optoelectronic circuit according to the invention.

FIG. 1 is a flow chart for designing an optoelectronic circuit according to the invention. After synoptically designing a system according to a requirement specification 20 in a system design step 21, a circuit connection list (net list) 10 is generated by way of a logical design step 22. Then, an optoelectronic design operation that characterizes the present invention is conducted in an optoelectronic design step 11.

Now, the individual steps of FIG. 1 will be described in greater detail. Firstly, the system configuration is synoptically determined according to a requirement specification 20 in a system design step 21. The requirement specification 20 includes the features to be realized, or a feature specification, and design restrictions. A feature specification shows the features that the circuit has to provide and are defined according to the application thereof, which may be an arbitrarily selected control algorithm, an image processing operation, a sound processing operation or some other applications. Design restrictions, on the other hand, include the performance, the power consumption rate, the cost, the design period and so on of the system to be designed. The roles to be taken respectively by hardware and software, the configuration of the hardware and so on are synoptically defined in the system design step 21. The items of hardware configuration that need to be defined typically include the number and the types of semiconductor chips, the number, the surface area and the volume of layers of electric wiring substrates and the configuration of optical connection module, which will be described in greater detail hereinafter. Note, however, some of the items may be subjected to design restrictions.

As pointed out earlier, conventionally, optical circuits and electronic circuits are separated from each other in the system design step and designed independently after the step. However, according to the invention, electronic circuits and optical circuits are not separated from each other in the system design step 21.

Then, a logical design step 22 follows to obtain a net list 10. A net list contains data describing connection-related information of circuits. The present invention does not specify the means to be used for obtaining a net list 10. In other word, appropriate logical synthesis tools and/or some other means may be used. For example, it is possible to obtain a net list of the gate level by describing it at the RTL (register transfer level), using the hardware description language, and carrying out a logical synthesis, using a logical synthesis tools. A simulation of logical verification may be conducted in this stage to raise the reliability of the design.

Alternatively, it is also possible to prepare a net list by using the C language for the description and carrying out an operational synthesis. It is also possible to carry out a logical design operation by using appropriate IP (intellectual property) macros such as those of processor, memory, interface, data compression and image processing. A net list may be prepared at an appropriate level by using connection-related information such as the transistor level, the gate level, the cell level, the functional block (a set of cells) level or the IP macro level. When designing an optoelectronic circuit having analog circuits, the circuit design of analog circuits is completed in this stage and used as macro to proceed with the net list preparing operation.

Subsequently, an optoelectronic design step 11 comes. The operation of this step is conducted according to the net list 10 to produce a design result (output information) 24. Masks are designed according to the design result 24 so that consequently semiconductor chips, printed circuit boards and/or optical modules including optical transmission mediums and optical ports are manufactured. When reconfigurable devices such as FPGAs are used in semiconductor chips, the internal configuration of the chips are altered, or reconfigured, according to the output information. Additionally, when inter-chip optical connections are reconfigurable, the inter-chip connections can be reconfigured according to the output information.

Figure 21:
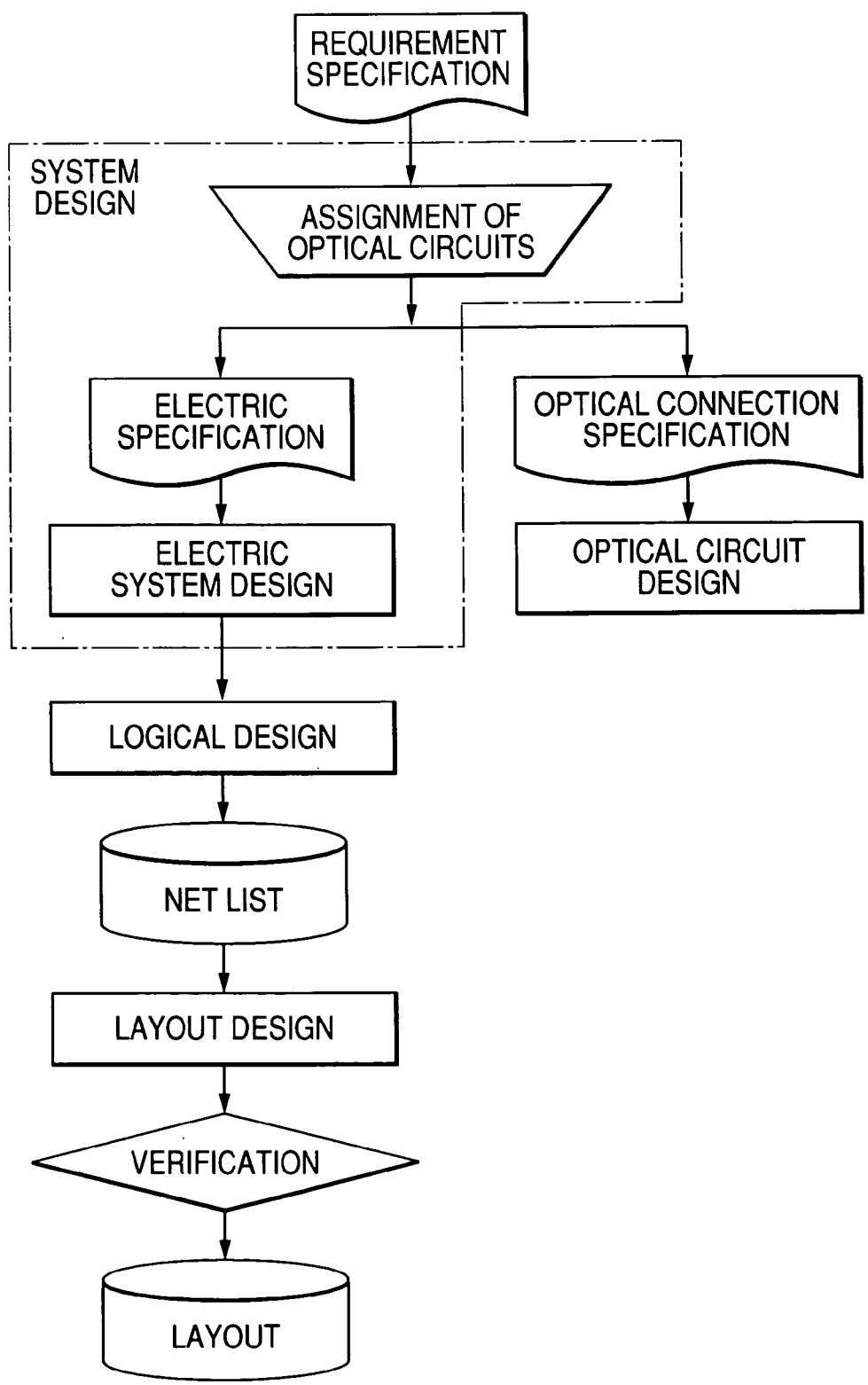
FIG. 21 is a flow chart of a conventional method of designing a system having optical connections and electronic circuits.

If compared with the above-described conventional design technique of separating electronic circuits and optical circuits in the initial system design stages as shown in FIG. 21, an optoelectronic circuit is designed (in the above-described second through fifth steps) after the generation of a net list (and hence after the logical design) with a design method and a design device according to the invention. Particularly, the assignment of optical connections and electric wires that is conducted in the second step comes after the step of generating a circuit connection list (net list) provides the following advantages.

Firstly, if one or more than one problems are detected in the design result in the verification step, it is necessary with the conventional technique to return to the most upstream system design step in order to alter the design (and discuss about the feasibility of redesigning, even if it is actually not necessary to do so). On the other hand, with the technique according to the present invention, it is only necessary to redesign in a step subsequent to the net list generation step. As a result, the load of redesigning is reduced to by turn reduce the time necessary for system development.

Next, the process down to the net list 10 generation step is not affected by the design restrictions relating to optical circuits using optical connections and hence it is easy to reutilize the net list that is an intellectual property. In other words, the net list prepared to realize a system only by means of electronic circuits can be used without any modification. Furthermore, when altering the specification of hardware including an optical module, it is not necessary to significantly alter the logical design. For example, it is not necessary to significantly alter the logical design to optimize and improve the performance of the optoelectronic circuit if the specification of the optical module is upgraded.

Now, the technique for the optoelectronic design step 11 of the present invention will be described below by referring to FIG. 2. A connection list (electric nets 13) to be carried by electronic circuits and a connection list (optical nets 14) to be carried by optical connections are firstly generated in the optoelectronic design step 11. In the step 12 of generating electric nets and optical nets, electric nets 13 and optical nets 14 are generated on the basis of the hardware specification (restrictive conditions) of optical module. For example, if the number of optical ports that can be mounted in an optical module is predetermined, the number of nets that can be handled as optical nets is limited. In view of this limitation, nets that are assigned as optical nets 14 are selected from the net list 10. At this time, it is preferable to maximally exploit the potential of the optical module.

It is possible to make a single optical connection (optical net) carry a plurality of net lists in this step 12. For example, a plurality of parallel connections can be carried by a one to one serial optical connection. Since the optical connection can transmit a signal at high speed, it is possible to transmit on a time division basis an amount of information for the transmission of which a number of wires need to be used. Besides, when a flexible optical circuit that utilizes a planar or two-dimensional (2D) optical waveguide is applied to the optical module, it may be conceivable to make broadcast optical connections to carry a number of fan-out signals. Functionally, a flexible optical circuit is a circuit that allows mutual optical connections among any combinations of optical ports.

Because a number of net lists can be carried by a smaller number of optical nets, the number of nets that can be handled as optical nets is not unequivocally determined. In other words, the number of electric nets can vary depending on the configuration of the optical module and the mode of assignment to optical nets. Particularly, optical connections show an enhanced degree of variety and can be assigned to optical nets in various different ways in a system realized by applying flexible optical circuits. For example, if it is assumed that the number of optical ports is predetermined, the number of nets that can be handled by 1:1 optical connections is limited to half of the number of ports. However, in the case of a flexible optical circuit, much more nets can be handled as optical nets.

When a flexible optical circuit is applied, it is preferable to minimize the number of electric nets 13 in the step 12 in order to fully exploit the features of a flexible optical circuit. In an actual design, a plurality of combinations of optical nets and electric nets are generated and the number of electric nets is computed for each of the combinations. Then, the combination that minimizes the number of electric nets is selected.

More specifically, high fan-out parts, high fan-in parts and parallel connection parts may be assigned to optical nets 14 with priority. FIGS. 3A and 3B are schematic illustrations showing that the number of electric nets is reduced by arranging broadcast optical connections in a fan-out part. FIG. 3A illustrates connections in a net list and FIG. 3B illustrate connections in optical nets. It will be appreciated that four nets in the net list (four electric nets) can be realized by a single optical net. Thus, it is possible to reduce the number of electric nets 13 by positively assigning such sites to optical nets 14.

The load of a driver can be raised and the electric signal waveform can show large disturbances by high fan-out electric connections. Therefore, assigning such sites to optical nets is preferable not only from the viewpoint of reducing the number of electric nets but also from the viewpoint of EMI of electric wiring.

Figure 4A:
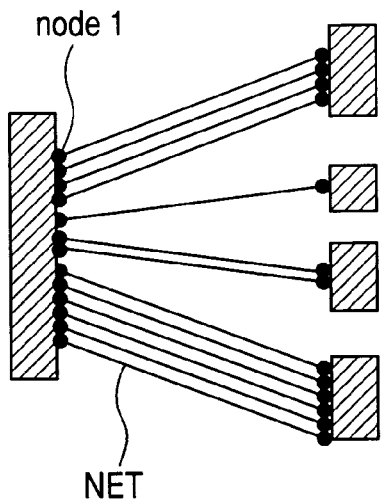
FIGS. 4A and 4B are schematic illustrations of an example of fan-out with parallel connection.
Figure 4B:
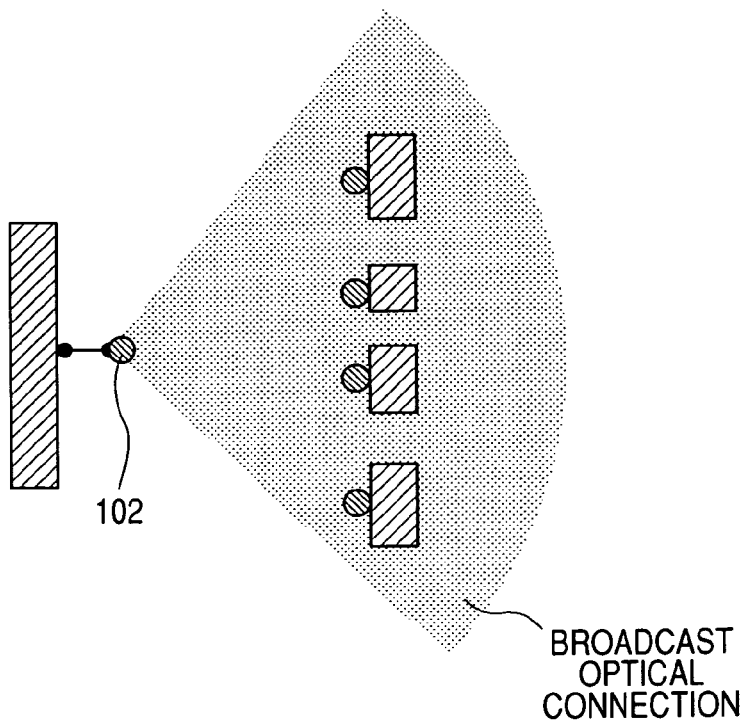

Additionally, it is also preferable to positively assign parallel wires to optical nets so as to be able to handle them as serial optical connections in order to exploit the features of optical connections having potentials of high speed data transmission. Still additionally, when the nets to be used for high speed signal transmission are known, they can also be assigned to optical nets. Particularly, since parallel electric wires for high speed transmission can easily give rise to cross talks, it is a preferable choice to replace them by optical connections from the viewpoint of EMI. On the basis of the above discussion, it is therefore highly desirable from the viewpoint of maximally exploiting the features of flexible optical circuits to assign parts shown in FIG. 4A where parallel connections fan out to optical nets having optical ports 102 as shown in FIG. 4B.

Thus, generation of electric nets 13 and optical nets 14 so as to minimize the number of electric nets 13 by means of the above-described technique provides the following advantages.

Firstly, wires (nets) that can easily constitute bottle necks in electric circuits and wires that can extensively provide restrictions to other electric wires can be assigned to optical nets with priority. As a result, it is possible to alleviate the load of a downstream electronic circuit layout design step 18. Additionally, it is possible to output a design result 24 that fully exploits the hardware configuration of flexible optical circuit. Thus, the ultimate design of the optoelectronic circuit and the ultimate configuration of the hardware can be produced in good shape.

While a technique of generating electric nets and optical nets so as to minimize the number of electric nets is described above in detail as preferable technique, the operation of the step 12 can be conducted according to some other guidelines. For example, a technique of minimizing the number of optical ports 102, that of minimizing the total length of electric wires, that of minimizing the power consumption rate and that of minimizing the circuit area may alternatively be used. In short, the technique to be used can be selected appropriately according to the feature specification to be ultimately aimed at.

After generating electric nets 13 and optical nets 14, if necessary, electronic circuits (electric nets) including one or more than one resisters, flip-flops, serializers and/or deserializers may be further added to the peripheries of the optical circuits. Then, they are added to the electric nets. For example, when parallel electric wires are assigned to optical connections, one or more than one serializers may be added to the optical ports 102 of the transmitter side whereas one or more than one deserializers may be added to the optical ports 102 of the receiver side. Such added electric nets increase the total number of electric nets and hence the addition may appear to be contradictory to the above-described preferable guideline of designing a system so as to minimize the number of electric nets. However, the added nets are found only locally in the peripheries of the optical ports and can hardly constitute serious bottle necks from the design point of view. In other words, such added nets do not need to be taken into consideration when reducing the number of electric nets.

The generation of electric nets and optical nets may be verified thereafter. For example, it may be verified if the contents of the net list before the division logically agree with the electric nets and the optical nets that are put together. Additionally, the optical nets and the added electronic circuits may be logically verified once again.

Then, the operation of the optoelectronic layout design step 15 is conducted on the basis of the electric nets 13 and the optical nets 14. In this step, the arrangement of various parts, the connections of electric wires and optical connections are designed. The term of "parts" as used herein refers to cells in LSIs of the standard cell format, functional blocks that are so many sets of cells, each having a single function, blocks corresponding to IP macros, and so on. In a system to which FPGAs are applied, the term also refers to logic cells, configurable blocks (sets of logic cells), blocks corresponding to IP macros and so on. In the case of a system where a number of chips are mounted, the term also refers to individual chips, devices and other parts. Finally, the term also refers to optical ports (ports that at least either output light or input light), which will be described in greater detail hereinafter.

Thus, in the case of an optoelectronic circuit where a number of chips are mounted, the arrangement of chips, that of optical ports, which will be described in greater detail hereinafter, inter-chip wirings, optical connections of optical ports, the arrangement of cells in each chip, the arrangement of electric wires in each chip are designed in this step.

In the optoelectronic layout design step 15 according to the invention, it is preferable to design so as to minimize the total length of electric wires. When the total length of electric wires is minimized, it indicates that the optical module, the flexible optical circuit in particular, operates effectively. While various techniques may be conceivable to minimize the total length of electric wires, the use of a design technique of giving priority to the arrangement of optical ports that are interfaces of optical circuits and electronic circuits is preferable. From this point of view, the operation of placement of optical ports 16 is firstly conducted as shown in FIG. 2. The placement of optical ports 16 is designed by taking both optical circuits and electronic circuits into consideration as described below. An optimally designed optoelectronic circuit can be obtained when the placement is designed by considering both optical circuits and electronic circuits.

It is preferable to arrange optical ports in a distributed manner because electric wires can be congested around each optical port that allows sophisticated connections. As a result of such a distributed arrangement, it is possible to effectively connect a number of electric nets to an optical port so that electronic circuits may be designed in various different ways (to expand the scope of design operation). Additionally, the optical module operates to effectively utilize the optical transmission medium and reduce cross talks. In shorts, such an arrangement of optical ports that operate as interfaces of optical circuits and electronic circuits is effective for both the electronic circuits and the optical circuits and ultimately enhances the performance of the optoelectronic circuit.

Additionally, it is preferable to arrange optical ports in such a way that the mode of connection that will put a heavy load on electric wires is realized by optical connections. With such an arrangement of optical ports, it is possible to optimize the design of the optoelectronic circuit as a whole. For example, while electric wires are normally arranged only in x- and y-directions, it is preferable to arrange optical ports intentionally in such a way that optical connections are produced in oblique directions.

With regard to the distance between an optical port for signal transmission and an optical port for signal reception, it is preferable that the distance between the transmission port and the reception port is made small from the viewpoint of optical module because the quantity of light that can be received is increased when the distance is reduced. On the other hand, however, in view of the fact that it is difficult for electric wires to take such a mode of connection and transmit signals over a long distance at high speed, the optical ports are preferably arranged with a long distance interposed between them because of the above-described difficulty to electric wires. Thus, in view of these contradictory requirements, it is preferable to separate the optical port for signal transmission and the optical port for signal reception maximally provided that the optical connection operates satisfactorily for signal transmission. For instance, the maximum inter-port distance may be estimated simply on the basis of the required data transmission speed and the data error rate and the ports may be separated maximally from each other within that distance (remotely located pairs of optical ports may be selected).

When broadcast optical connections are introduced into a flexible optical circuit, it is preferable to arrange optical ports so as to reduce the angle of radiation of light in order to effectively utilize light from the viewpoint of optical module. On the other hand, in view of the difficulty for electric wires to take such a mode of connection, it is preferable to arrange optical ports so as to be able to broadcast with a large angle because a wide broadcast electric wiring can impose serious restrictions onto other wiring layouts. In view of these contradictory requirements, it is preferable in this embodiment that optical ports are arranged to realize a maximally wide broadcast provided that the optical connections operate properly for signal transmission. A guideline that gives priority to a wide broadcast may be adopted for the arrangement of optical ports when the circuit area and the performance are important, whereas a guideline that gives priority to a narrow broadcast may be adopted for the arrangement of optical ports when the power consumption rate is important.

Thus, not only the optical module but also the optoelectronic circuit is designed optimally as a whole by conducting the operation of placement of optical ports 16 so as to use optical connections for a mode of connection that is difficult for electric wires to take. When hardware where the positions of optical ports are predefined is used, the operation of placement of optical ports 16 will be an operation of selecting optical ports to be assigned respectively to the optical nets. Then, this assignment operation may be conducted on the basis of the above-described concept.

While the total length of electric wires is given priority for the arrangement of optical ports in the above description of a preferable example of optoelectronic layout, the operation of the step 15 may be conducted according to some other guidelines. For example, a guideline for minimizing the power consumption rate or a guideline for minimizing the circuit area may alternatively be used. Thus, an appropriate guideline may be selected according to the feature specification to be ultimately aimed at.

Thereafter, the operation of electronic circuit layout design 18 and that of optical connection design 17 are conducted respectively on the basis of the electric nets 13 and the optical nets 14. So long as the operation of the arrangement of optical ports 16 is completed, it does not matter which of the operation of the electronic circuit layout design 18 and that of the optical connection design 17 comes first. Either of the two operations may be conducted first or the two operations may be conducted in parallel. Note, however, they are conducted independently.

In the operation of electronic circuit layout design 18, the parts other than the optical ports are arranged and an electric wiring operation is conducted, while an electronic circuit analysis is made. However, since the operation of placement of optical ports is completed in a preceding step, the outcome of the operation provides a restricting condition for the placement and electric wiring of electronic circuits. Any popular technique may be used for the placement and electric wiring of electronic circuits. For example, techniques that can be used for the placement of electronic circuits include the min-cut placement technique and so on, whereas techniques that can be used for the electric wiring of electronic circuits include the line search router technique, the maze-running router technique, the channel router technique and so on. For the electric wiring, a summary wiring operation of assigning nets to the channels defined in the wiring region and a detailed wiring operation of determining the wiring route in each channel may be conducted separately. For the electronic circuit analysis, the signal delay of each net is computed from the wiring resistance and the wiring capacitance of the wires and a timing analysis is made on the basis of the delays. Additionally, an EMI analysis may be made for cross talks and waveform distortions.

Then, the total length of electric wires is computed from the outcome of the electronic circuit layout design operation. It is possible to design and carry out computing operations for various arrangements of optical ports and select the arrangement of optical ports that minimizes the total length of electric wires.

Figure 13:
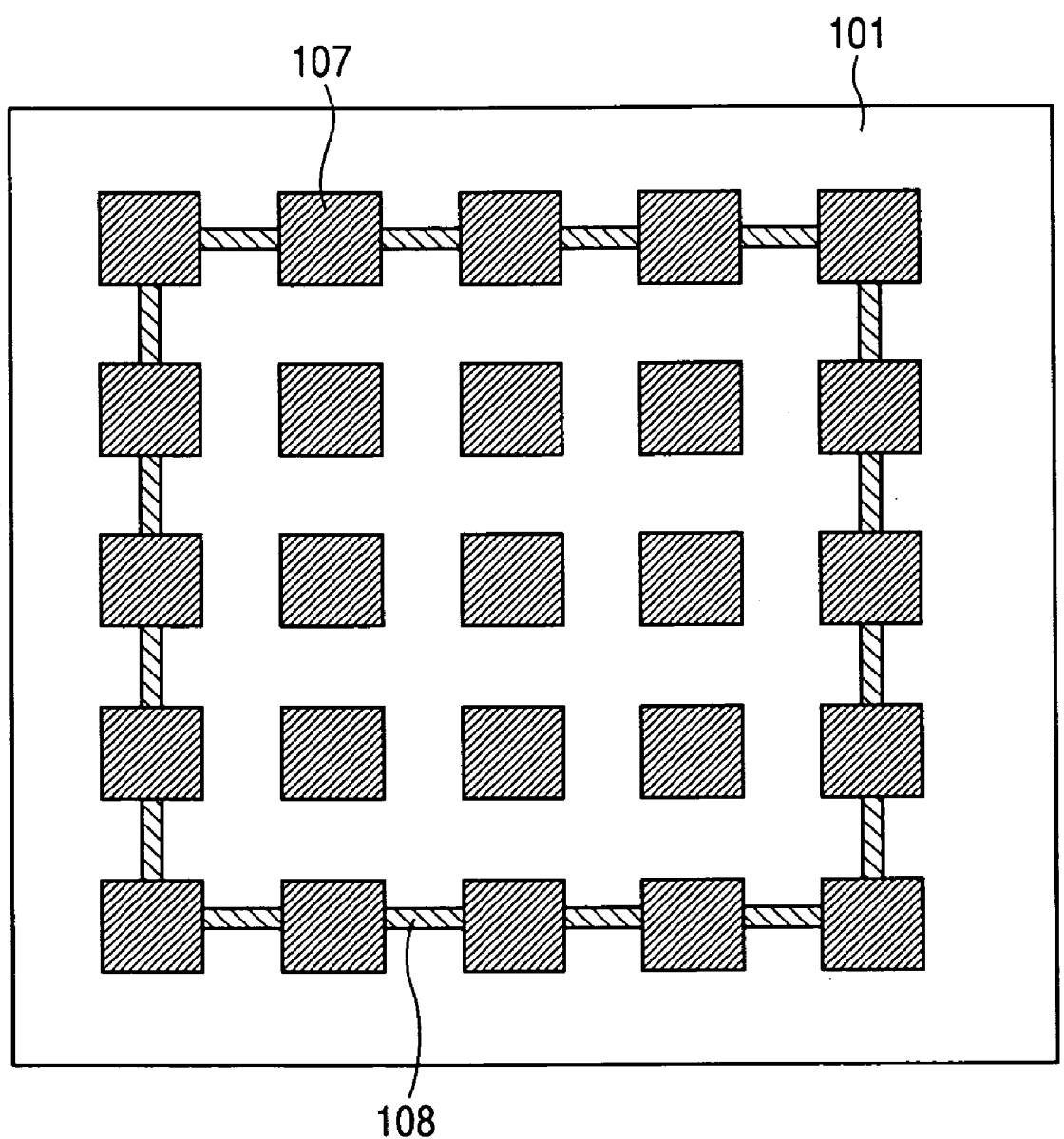
FIG. 13 is a schematic illustration of a flexible optical circuit having a line waveguide.

In the operation of optical connection design 17, optical transmission mediums and optical ports are designed and an optical connection analysis is made. The configurations of 2D optical waveguides (profiles, thicknesses) are designed at the time of designing optical transmission mediums. When an optical transmission medium 101 where a line waveguide 108 is buried in a 2D optical waveguide as shown in FIG. 13 is used, the arrangement and the configuration of the line waveguide are designed. The configuration of each optical port for signal transmission and that of each optical port for signal reception are determined and the type of each port is defined at the time of designing optical ports. Additionally, in what mode light is transmitted and in which light radiation angle and in which light radiation direction and at which transmission speed light is transmitted at each optical port are defined. As optical connection analysis, the quantity of light to be used for each optical connection is analyzed and a transmission rate analysis and a delay analysis are made on the basis of the outcome of the quantity of light analysis.

Thereafter, in the verification step 19, it is verified if the design result satisfies the requirement specification (feature, circuit speed, circuit area, power consumption rate) or not. It can be verified by way of various simulations. Particularly, when verifying the timing of each circuit, it is preferable to make an analysis by taking both the delay analysis of the electric nets and that of the optical nets in to consideration.

When one or more than one problems are detected in the verification step, the design operation may be returned to a preceding step for redesigning. However, it is not necessary to return to a step before the net list 10. After the verification step, the outcome of the design operation is adopted as final design result 24.

The above-described technique of designing an optoelectronic circuit of this embodiment provides the following advantages. It is possible not only to optimally design the optical circuits and the electronic circuits but also the entire optoelectronic circuit in terms of arrangement of devices, electric wiring and configuration of optical connections in a relatively short period of time. Particularly, when generating electric nets 13 and optical nets 14 so as to minimize the number of electric nets, the load of the operation of electronic circuit layout design 18 is reduced for designing an excellent optoelectronic circuit as a whole. An excellent optoelectronic circuit can be designed as a whole because priority is given to the arrangement of optical ports that operate as interfaces of optical circuits and electronic circuits. In short, not only the electronic circuits and the optical circuits are optimized, but also the entire optoelectronic circuit is optimized.

Additionally, the fact that the operation of optoelectronic layout design 15 is conducted after generating electric nets 13 and optical nets 14 from the net list 10 according to an appropriate guideline provides advantages including a high design reliability, a high design reproducibility and easiness of reutilizing the design assets. Furthermore, the ultimate design result 24 can be obtained without repeating the process of returning to a preceding step after the end of the verification step for a large number of times.

<Another Example of Step of Optoelectronic Layout>

Figure 15:
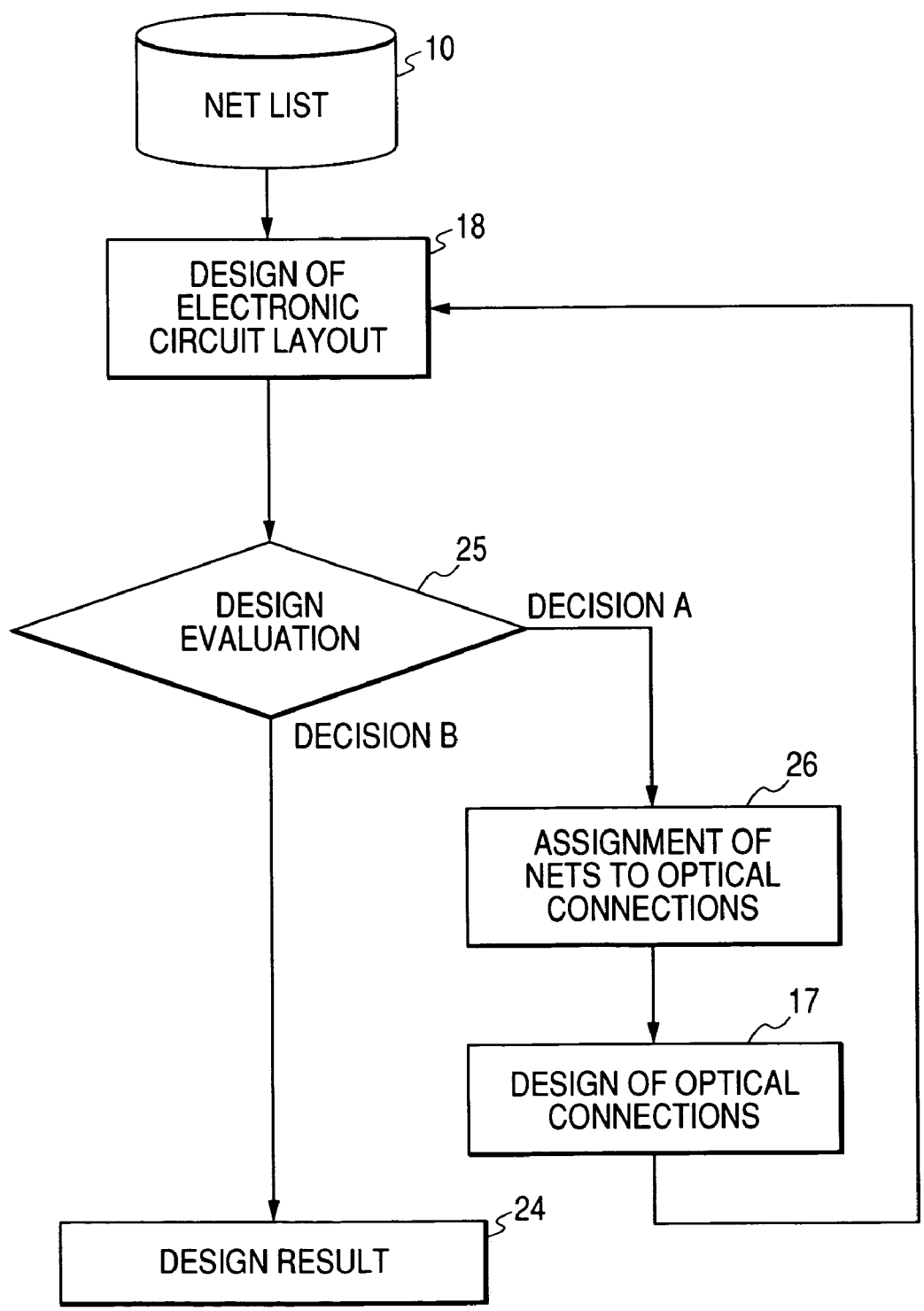
FIG. 15 is a flow chart for designing an optoelectronic circuit according to the invention (optoelectronic layout section)

Another example of the above-described step of optoelectronic layout will be described in greater detail by referring to the flow chart of FIG. 15.

This step includes;

a step 18 of conducting an operation of electronic circuit layout (place and route of electronic circuits) design on the basis of the net list 10 a step 25 of design evaluation having branches a step 26 of assigning part of the nets to optical connections and a step 17 of designing optical connections.

Now, each of the above steps will be described by referring to the flow chart of FIG. 15.

Firstly, parts are arranged, an electric wiring operation is conducted and an electronic circuit analysis is made in the step 18 for the first session of electronic circuit layout design. Any popular technique may be used for the arrangement and electric wiring of electronic circuits. For example, techniques that can be used for the arrangement of electronic circuits include the min-cut placement technique and so on, whereas techniques that can be used for the electric wiring of electronic circuits include the line search router technique, the maze-running router technique, the channel router technique and so on. For the electric wiring, a summary wiring operation of assigning nets to the channels defined in the wiring region and a detailed wiring operation of determining the wiring route in each channel may be conducted separately. For the electronic circuit analysis, the signal delay of each net is computed from the wiring resistance and the wiring capacitance of the wires and a timing analysis is made on the basis of the delays. Additionally, an EMI analysis may be made for cross talks and waveform distortions.

While it is desirable that the first session of electronic circuit layout design satisfies the requirement specification (circuit speed, circuit area, power consumption rate), it does not necessarily have to satisfy the requirement specification because it can be improved in the downstream of the flow. In this sense, it is sufficient to make a design whose load is lighter than any conventional layout design. Particularly, the design time can be effectively reduced by specifying the design time for the operation of electronic circuit layout design in advance. Then, the optimum one of the solutions acquired within the design time is selected as design result and the operation proceeds to the next step.

Thereafter, an operation of design evaluation 25 is conducted for the first time. In the first session of design evaluation, the extent to which the outcome of the first operation of electronic circuit layout design satisfies the requirement specification (circuit speed, circuit area, power consumption rate), and the problems of the outcome are evaluated among others. On the basis of the first session of design evaluation, either of the following decisions will be made. decision A: proceed to the step of optical connection to improve the design. decision B; output layout information and terminate the design (to proceed to the next step)

The designer can appropriately define the criteria of decision including the circuit speed, the power consumption rate, the number of gates, the circuit area and the total wire length of the electronic circuits. Priority may be given to these criteria and the criteria may be weighted appropriately to define a target function so that evaluations may be rated by computing the target function.

For example, the simplest rating system may be that the decision A is made when the requirement specification is not satisfied (no) and the decision B is made when the requirement specification is satisfied (yes). When the decision A is made, the design operation proceeds to the step 13 of assigning optical connections. The outcome of the analysis including the layout and the computation of the delay time are stored before proceeding to the step 13.

In step 26 of assigning part of the nets to optical connections, part of the net list is assigned to optical connections. Optical connection nets are generated on the basis of the assigned nets (if optical connection nets already exist, they are updated). The remaining part of the net list that is left after assigning the first part to optical connection nets is used to generate electric nets. It is possible to make a plurality of electric wires carry optical connections in this assigning operation. For example, it may be conceivable that a plurality of parallel wires can be carried by a one to one serial optical connection and a plurality of fan-out signals can be carried by broadcast optical connections.

Nets may be assigned to optical connections randomly or according to an assignment guideline. Random assignment is a fast assignment process, whereas assignment according to a guideline is a high performance assignment process that shows an enhanced degree of reliability. When nets are assigned according to a guideline, nets to be assigned will be selected by referring to the outcome of the preceding layout operation, the outcome of the circuit analysis (the outcome of the electric wiring delay analysis) and the restricting conditions of the optical module.

Examples of assignment guidelines include one for assigning nets that transmit signals at high speed, one for assigning nets that require long distance connections, one for assigning nets that pass through vias, one for assigning nets that show a long wiring distance relative to the straight line distance, one for assigning high fan-out nets, one for assigning high fan-in nets and one for assigning parallel wires.

Then comes a step 17 of designing and analyzing optical connections for the optical nets in the connection list carried by optical connections. Optical transmission mediums and optical ports are designed when designing optical connections.

Subsequently, the operation of electronic circuit layout design 18 is conducted for the second time on the basis of the electric nets. A technique similar to the one used for the first time may be used here. Note, however, since part of the nets has already been assigned to optical connections unlike the first operation, the number of electric nets is reduced if compared with the number of electric nets (in the initial net list) that existed for the first operation. On the other hand, the number of optical ports, which are also parts, that of the wires leading to the optical ports and that of electronic circuits have been increased. Since the breakdown of electric nets has been changed, the optimum solution for the second electronic circuit layout design differs from the optimum solution for the first electronic circuit layout design.

The second electronic circuit layout design may be a separate one that is laid independently from the first one or may be one obtained by improving the first one. If it is obtained by improving the first one, the parts connected to optical ports may be rearranged with priority. Additionally, the timing analysis is preferably made by taking both the outcome of the delays of the electric nets in the connection lists carried by electronic circuits and the outcome of the delays of the optical nets (including those of the added part) into consideration.

Subsequently, after the second operation of electronic circuit layout design 18, the operation of design evaluation 25 is conducted for the second time. The second operation of design evaluation 25 can be conducted by means of a technique similar to the one used for the first operation of design evaluation. More specifically, either decision A or decision B is made by referring to the criteria of design evaluation. As in the case of the first design evaluation, the criteria of decision may include the circuit speed, the power consumption rate, the number of gates, the circuit area and the total wire length of the electronic circuits. Additionally, the effective utilization of optical ports for optical connections may be included in the criteria.

In the second and subsequent design evaluations 25, if the outcome is improved or aggravated from the last one or the ones obtained in the past may be judged. The number of times of conducting the design evaluation step may be included in the criteria of decision.

It is possible to add part of some other electric nets as optical nets in addition to the existing optical nets in the second and subsequent operations of assigning optical nets. It is also possible to omit optical nets that already exist and some other electric nets may be added as optical nets. Note, however, the initial net list is found either in the electric nets or in the optical nets without fail.

The design is improved gradually by repeating the above-described sequence. In other words, the sequence of assigning part of the nets to optical connections, laying out electronic circuits and evaluating the outcome of the layout is repeated for a number of times to realize an improved optimal design.

The above-described technique provides the following advantages.

In the conventional design using only electric nets, the arrangement and electric wiring of electronic circuits is an operation that has to be repeated for a number of times until the requirement specification is met and hence very time consuming. Additionally, the conventional technique is short of redundancy and flexibility when alternating the specification. To the contrary, the above-described technique of the present invention provides a wide choice of operational sequences for new optical connections to improve the efficiency of the design operation and an enhanced degree of redundancy for accommodating alterations to the specification.

Additionally, with the above-described design technique of the present invention, it is possible not only to optimally design the optical circuits and the electronic circuits but also the entire optoelectronic circuit in terms of arrangement of devices, electric wiring and configuration of optical connections in a relatively short period of time. Still additionally, since the operation of designing electronic circuits and that of designing optical connections are conducted alternately on a time series basis, the overall operation proceeds straight to enhance the stability of the flow of design operation. Furthermore, general electronic circuit design tools can be used for designing the layout of electronic circuits for the purpose of the present invention to make the design technique of the present invention highly compatible with such general electronic circuit design tools.

Now, the present invention will be described in greater detail by way of specific examples. However, it should be noted that the present invention is by no means limited to the examples described below and the embodiments of the present invention as described herein can be modified in various different ways in terms of configuration, manufacturing process, sequence and addition and omission of steps.

EXAMPLE 1

Figure 5A:
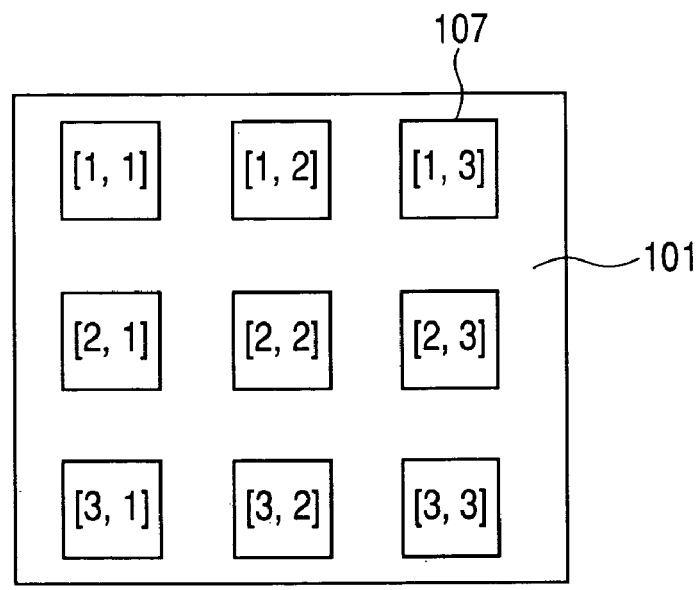
FIGS. 5A and 5B are schematic illustrations of the configuration of a reconfigurable optoelectronic circuit used in Example 1.

In this example, a reconfigurable optoelectronic circuit is used as hardware and the above-described optoelectronic layout technique is applied to the automatic design of the circuit. The reconfigurable optoelectronic circuit as used herein is a circuit where reconfigurable electronic circuits (FPGAs) 107 as shown in FIG. 5A and flexible optical circuits using planar or two-dimensional (2D) optical waveguides (sheet-shaped optical transmission mediums) 101, which will be described in greater detail hereinafter, coexist as mixture.

Reconfigurable electronic circuits including FPGAs tend to require longer time and higher cost for optimizing the design as a result of the efforts for raising the scale and the degree of integration because of the increased influence of electric wiring delay that come to intervene. On the other hand, systems that need to be reconfigurable on a real time basis are required to be designed in a short period of time. Additionally, while techniques of electrically connecting a plurality of FPGAs are being used for the purpose of scaling up, inter-chip electric wiring is fixed wiring that lacks flexibility so that severe restrictions are imposed for a plurality of chips to operate as reconfigurable circuits.

The reconfigurable optoelectronic circuit of this example dissolves the above problems by interconnecting FPGAs by way of flexible optical circuits. A flexible optical circuit shows a remarkably high degree of freedom of connection because it is intrinsically adapted to complete couplings (and has coupling characteristics that allow to realize free optical connections among optical ports) and multi-cast transmissions. Due to these properties, it is possible to reconfigure a plurality of chips with an enhanced degree of freedom by connecting FPGAs by way of flexible optical circuits. Thus, an optoelectronic circuit that is formed in this way is a reconfigurable circuit that can operate at high speed and has flexible connectivity in addition to being a large scale circuit. Additionally, such an optoelectronic circuit can alleviate the problem of delays of RC signals in the intra-chip wires and that of EMIs as a result of using optical connections so that it can be realized as a reconfigurable circuit that is of large scale and operates at high speed.

While an optoelectronic circuit having flexible optical circuits provides the advantage of having a remarkably high degree of freedom for optical connections, it also provides a wide choice of alternative designs that makes it rather difficult to realize an optimum design. From this point of view, development of sophisticated design techniques is desired particularly for optoelectronic circuits using flexible optical circuits. Therefore, the design technique of the present invention that is adapted to realize a highly reliable optimum design can be suitably applied to reconfigurable optoelectronic circuits, which will be described in greater detail hereinafter.

<Hardware>

Figure 5B:
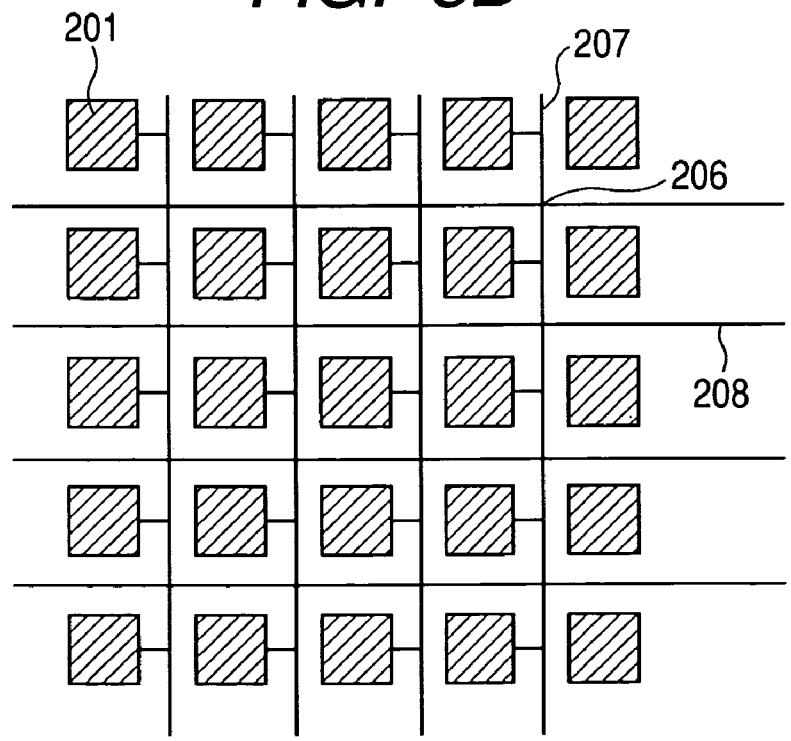
Figure 6:
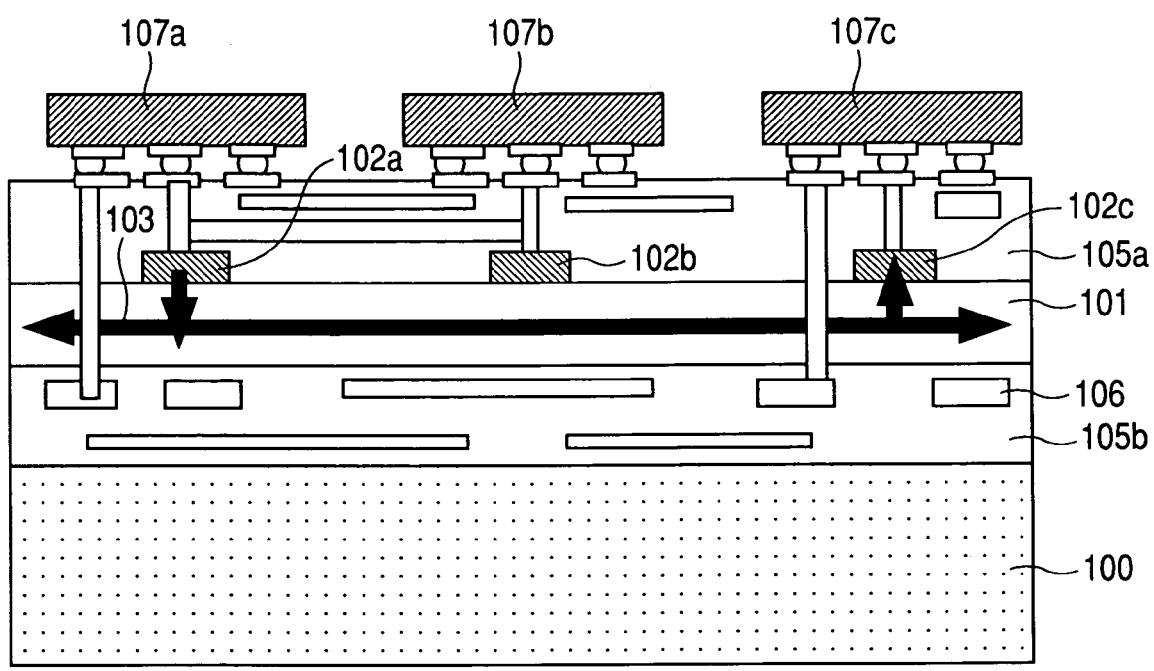
FIG. 6 is a schematic illustration of the configuration of a reconfigurable optoelectronic circuit used in Example 1.

Firstly, the hardware, which is a reconfigurable optoelectronic circuit, of this example will be described in detail by referring to FIGS. 5A, 5B and 6. FIGS. 5A, 5B and 6 are schematic illustrations of the configuration of a reconfigurable optoelectronic circuit that is used in this example. FIGS. 5A and 5B show a two-dimensional layout of the circuit and FIG. 6 is a cross sectional view of the circuit. FIG. 5B shows a detailed description of a single FPGA in FIG. 5A. Referring to FIGS. 5A, 5B and 6, there are shown a substrate 100, a two-dimensional (2D) optical transmission medium (2D waveguide) 101, optical ports 102 (102a to 102c) for outputting and/or inputting light, light 103 being transmitted through the optical transmission medium 101, electric wiring layers 105 (105a, 105b), electric wires 106, reconfigurable electronic devices (logical block) 107 (107a to 107c), logical elements 201, intersections 206, connecting sections 207 and a matrix wiring 208 that is an electric connection network. As shown in FIG. 5A, a plurality of (nine) FPGAs having 400 thousands gates are mounted as reconfigurable electronic circuits 107 and interconnected by way of the electric wires 106 and the optical transmission medium 101, which operates as flexible optical circuit.

As shown in FIG. 6, an electronic module having FPGAs and electric wiring layers 105 and an optical module having a 2D waveguide 101 and optical ports 102 are laid one on the other and bonded to each other to form a layered structure. Additionally, the electric wiring layers 105 having electric wires 106 for connecting chips 107 are laid one on the other and compactly installed. While the optical transmission medium 101 may have any desired number of layers, it is realized as a single layer medium in this example. The FPGAs are located close to each other and connected to each other by 32 electric wires in the electric wiring layers 105.

Additionally, as shown in FIG. 6, the optical transmission medium 101 is sandwiched by the electronic wiring layers 105a, 105b and the optical ports 102 are arranged near the interface of the electric wiring layer 105a and the optical transmission medium 101. The substrate 100 has a size of 3 cm square. As shown in the plan view of FIG. 5A, there are a total of nine FPGAs 107 ([1,1] through [3,3]) that are provided with respective optical ports 102. In other words, each FPGA 107 is provided with a single optical port 102. In this way, the FPGAs 107 are connected to the respective optical ports 102 that operate to transmit and/or receive optical signals with the optical transmission medium 101 (the optical ports are not shown in FIGS. 5A and 5B).

As pointed about above, the optical transmission medium 101 is a 2D optical waveguide, which is formed by coating a 100 μm thick polycarbonate substrate (refractive index: 1.59) with fluorinated polyimide (refractive index: about 1.52) as clad. With the optical connections that are established in this way, the electric signal output from an FPGA 107 is converted into an optical signal by the corresponding optical port 102, which optical signal is then transmitted through the optical transmission medium 101, which is a 2D optical waveguide, and then converted back into an electric signal by some other optical port 102 so as to be input to the corresponding FPGA 107.

In this way, the FPGAs are interconnected by way of both electric wires and flexible optical circuits. Weather the electric wire or the flexible optical circuit is used by an FPGA for signal transmission is determined by selecting the connection terminal in the signal transmitting FPGA.

As described above, the optoelectronic circuit of this example is adapted to alter not only the internal configuration of each of the electronic circuits (FPGAs) 107 but also the configuration of the entire circuit by freely changing the inter-FPGA optical connections. That is, the inter-EPGA connections through flexible optical circuits can be reconfigured.

Now, the configuration of a flexible optical circuit will be described below.

A flexible optical circuit is a circuit adapted to transmit information by using light as carrier. It can freely alter the mode of transmission of information among optical ports 102 by way of an optical transmission medium 101. In this example, the flexible optical circuit comprises the 2D waveguide (planar optical waveguide) 101 and the optical ports 102.

Figure 11A:
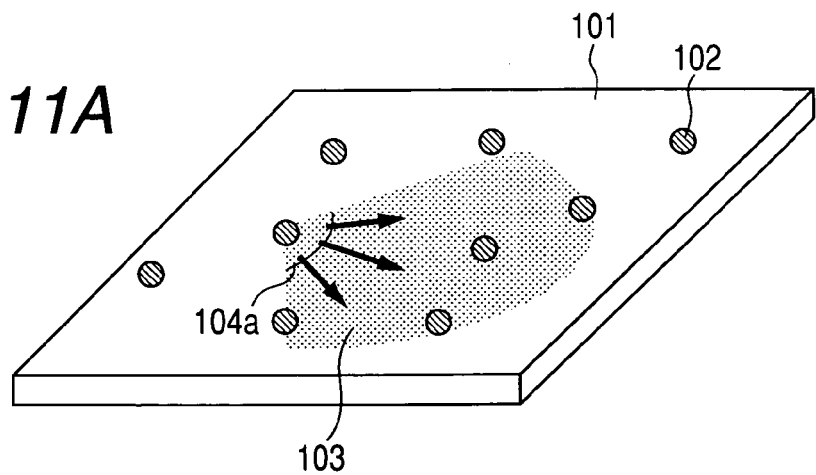
FIGS. 11A and 11B are schematic illustrations of a flexible optical circuit.
Figure 11B:
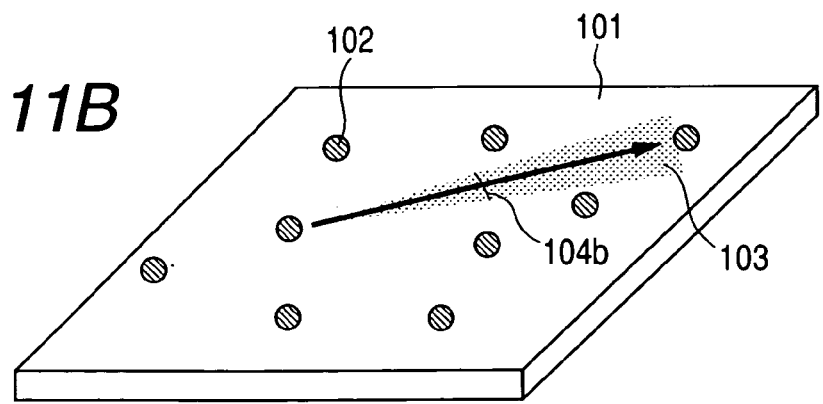

In a flexible optical circuit, it is possible to arrange optical ports at any desired positions in the two-dimensional waveguide and two-dimensionally transmit optical data from an optical port to another optical port that are arranged at desired respective positions. For example, it is possible to propagate light 103 with any appropriate radiation angle (104a and 104b) in intra-planar directions of the optical transmission medium 101 as shown in FIGS. 11A and 11B. Each optical port can operate for broadcast transmission of optical signals to all other optical ports. As pointed out above, the electric signal from an FPGA 107 is converted into an optical signal at the corresponding optical port 102 and, after being propagated through the optical transmission medium 101, converted back into an electric signal by some other optical port 102 so as to be input to the corresponding FPGA 107.

The optical ports 102 have a feature of transmitting and/or receiving optical signals. More specifically, each optical port 102 has an optical output section for converting an electric signal into an optical signal and/or an optical input section for converting an optical signal into an electric signal. The light emitted from the light emitting element that operates as optical output section of the optical port that transmits a signal is propagated through the optical transmission medium 101 and input to the light receiving element that operates as optical input section of the optical port that receives the signal. As the signal is converted into an electric signal by the signal receiving optical port, the signal is transmitted from one signal transmitting optical port to another signal receiving port to operate as optical circuit.

A surface emission laser may typically be used for the optical output section. More specifically, the electric signal is converted into an optical signal as the logic signal (e.g., of 3.3V) of an FPGA 107 that is input to the optical port 102 thereof is applied to the light emitting element so as to produce a forward bias. The light emitting element may typically be a 0.85 μm band surface emission laser (VCSEL: vertical cavity surface emitting laser). A VCSEL has a standard characteristic of producing an optical output of 3 mW when the drive current is 3.0 mA.

Figure 12A:
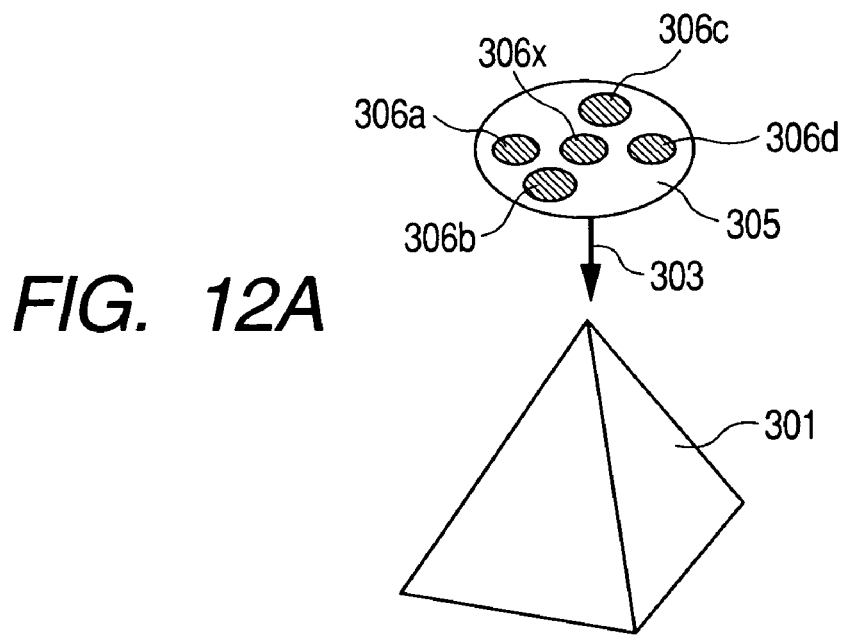
FIGS. 12A, 12B and 12C are schematic illustrations of the optical coupling section of an optical port.
Figure 12B:
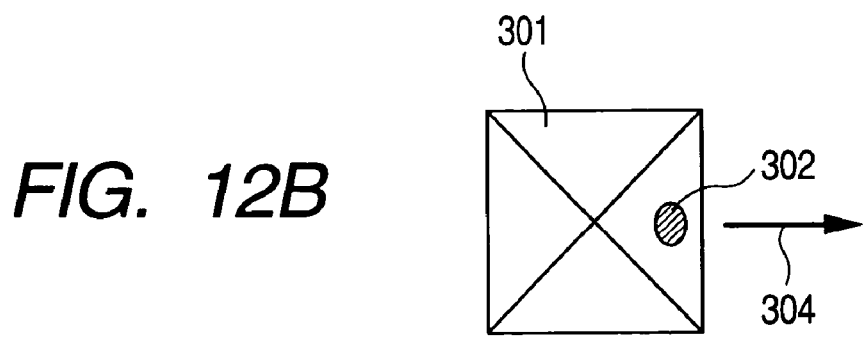
Figure 12C:
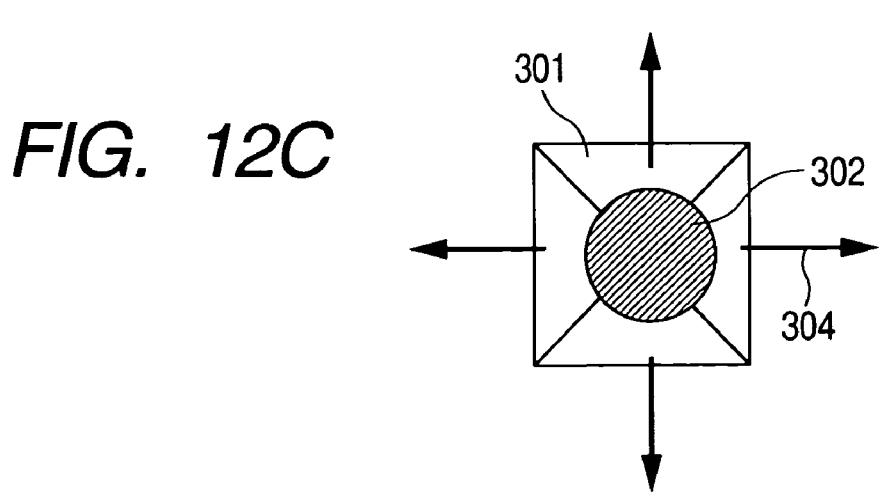

As shown in FIGS. 11A and 11B, optical ports 102 are arranged so as to be able to propagate light with various intra-planar radiation angle and radiation directions. To realize this capability, a mirror having a profile of a quadrangular prism as shown in FIG. 12A may be used as optical coupler 301 for optically coupling an optical port 102 and the optical transmission medium 101. In the instance of FIG. 12A, a beam of light 303 from the light emitting element 306 (light emitting elements 306a through 306d, 306x) of the optical output section 305 is irradiated from above to the top of the prism mirror 301 and reflected transversally so as to be coupled to the optical transmission medium 101. When a beam of light from the light emitting element 306 irradiates light irradiation spot 302 on a slope of the prism 301 as shown in FIG. 12B, light 304 is propagated with an intra-planar radiation angle of about 90°. When beams of light irradiate four slopes as shown in FIG. 12C, light 304 is propagated with an intra-planar radiation angle of 360°. Thus, when beams of light irradiate two or three slopes of the prism 301, light 304 is propagated with an intra-planar radiation angle of 180° or 270°, whichever appropriate. Since the slopes of the prism are diffusion surfaces, light is uniformly propagated over the entire radiation angle.

In the instance of FIGS. 12A through 12C, a total of five light emitting elements 306a, 306b, 306c, 306d, 306x including those for the respective slopes and one for the center are arranged above the prism mirror 301 in such a way that beams of light from the respective elements irradiate the respective slopes. With this arrangement, the angle of radiation can be selected by selecting one or more than one light emitting elements. For example, when the central light emitting element 306x is selected, light is propagated with an intra-planar radiation angle of 360°. When one of the light emitting elements 306a through 306d is selected, light is propagated with an intra-planar radiation angle of 90° in the direction corresponding to the selected light emitting element. Light is propagated with an intra-planar radiation angle of 180° when two of the light emitting elements 306a through 306d are selected, where as light is propagated with an intra-planar radiation angle of 270° when three of the light emitting elements 306a through 306d are selected and with an intra-planar radiation angle of 360° when all the four light emitting elements 306a through 306d are selected. In this way, the angle and the direction of radiation can be switched by arranging a plurality of light emitting elements at the optical port 102 and selecting one or more than one light emitting elements to be driven. The light emitting elements to be driven can be selected by means of the corresponding FPGA 107.

While a prism mirror is used and the angle and the direction of radiation can be defined on the basis of a unit of 90° in the above-described optical port, the configuration of the optical port is by no means limited thereto. An optical port that can substantially broadcast in all directions of 360°, an optical port that can propagate light with a relatively small radiation angle that substantially corresponds to the radiation angle of the light emitting elements so that light may be propagated substantially as a beam or an optical port that can propagate light in many different directions may alternatively be used.

The optical signal that is propagated through the optical transmission medium 101 is taken in by the light receiving element of the corresponding optical port 102 and converted in an electric signal. An Si-PIN photodiode may be used for the light receiving element and connected to the electronic circuit 107. The electronic signal obtained by the conversion is taken into the inside of the electronic circuit 107 that is typically an LSI located nearby and processed as input electric signal. If an preamp for amplifying the electric signal is integrally arranged with the light receiving element, the signal voltage can be restored to the CMOS compatible level. When an optical coupler (see optical coupler 301 in FIGS. 12A through 12C) having a conical profile is used in the light receiving section, it is possible to receive light from all directions of 360° of the 2D optical waveguide 101. In this way, the feature of a flexible optical circuit can be realized to make it possible to establish an optical connection between optical ports by using optical ports and a 2D optical waveguide and freely propagating light in the optical waveguide.

While an optical port that can receive light from all directions of 360° of a 2D optical waveguide is described above, an optical port may alternatively be provided with a plurality of light receiving sections where it can receive light only from a limited direction so that the optical signal it receive may be selected by selecting one of the light receiving sections as in the case of the optical port for signal transmission.

As described above, in this example, the circuit connections are altered (reconfigured) by altering the angle and the direction of radiation of light from the signal transmitting optical port to select the destination of signal transmission or by altering the light receiving direction of the signal receiving optical port. Alternatively, it is possible to reconfigure the circuit by selecting data at the signal receiving optical port. For example, the signal transmitting optical port may operate for broadcast transmission by using packet signal for the information to be transmitted and assigning addresses to packets. Then, the information can be transmitted to the target signal receiving port as the signal receiving port selects packets by means of the addresses assigned to them.

Thus, a flexible optical circuit is a circuit that can realize a two-directional complete coupling at an optical port. Additionally, it can realize an 1:N multicast communication and an N:M communication. Still additionally, it can freely alter the connections of 1:1 multicast communication, those of 1:N communication, and those of N:M communication so that 1:1 transmission, 1:N transmission and N:M transmission can be switched (reconfigured) freely. The data transfer rate between optical ports of the flexible optical circuit of this example is maximally 1 Gbps and typically 500 Mbps.

The use of a 2D waveguide is preferable for the flexible optical circuit if compared with a line waveguide and a free space connection. The reason for this will be described below. Firstly, it may be conceivable to use an optical circuit comprising optical fibers and a line waveguide. However, then fixed line wiring has to be used to reduce the degree of freedom of wiring. To reconfigure an optical circuit with such an arrangement accompanies difficulties because a large number of optical switches are needed. Additionally, a linear optical waveguide requires alignment of optical axes of the order of several microns to tens of several microns, which is very difficult. Still additionally, such an optical waveguide requires micro-machining and it is difficult to prepare such an optical waveguide.

Furthermore, by using a 2D waveguide, it is possible to mount optical devices (light emitting elements and light receiving elements) at any desired positions so that information can be conveyed between any positions. Still additionally, optical alignment will be realized with ease when optically coupling optical devices and a waveguide layer. Thus, the use of a 2D waveguide for a flexible optical circuit provides advantages including that a circuit board can be formed with ease at low cost because the 2D waveguide has a simple configuration and that the optical circuit can be reconfigured simply by controlling the optical ports that are basically light input/output sections as will be described in greater detail hereinafter.

On the other hand, since a line waveguide can transmit signals at high speed, it may be buried in a 2D optical waveguide to bear predetermined fixed connections. For example, as shown in FIG. 13, a line waveguide 108 may be provided to connect chips 107 that are remote from each other. While a system of propagating light in a free space that operates as optical transmission medium has been proposed and such a system provides a high degree of wiring freedom, it is accompanied by a problem of large overall dimensions. The arrangement using a flexible optical circuit that comprises a 2D optical waveguide can realize a circuit board that is thin and wired highly densely.

In a reconfigurable optoelectronic circuit as described above, not only the circuit configuration of the inside of the FPGAs but also the optical connections of the flexible optical circuit is reconfigurable. The configuration data necessary for reconfiguration are information that is output depending on the design of the optoelectronic circuit described above.

The reconfigurable optoelectronic circuit of this example is adapted to reconfigure the entire circuit by reading configuration data from outside. The internal circuit design of the FPGA can be altered by rewriting the configuration data to reconfigure the electronic circuits (the connections in the insides of the FPGAs, the inter-FPGA electric connections) and further more it is possible to alter (reconfigure) the inter-FPGA connections that are realized by way of flexible optical circuits typically by selecting optical ports. More specifically, the angle and the direction of radiation are altered at each optical port according to the configuration data to reconfigure the optical circuits. When the hardware is adapted to select the mode of optical connection by controlling the movable parts such as mirrors in the optical ports, the mode of optical connection can be altered (and hence the optoelectronic circuit can be reconfigured) by controlling the movable parts.

When reconfiguring the optoelectronic circuit, the circuit may entirely or partly be reconfigured. When a similar function is realized, it is preferable to partly reconfigure the circuit because the operation of reconfiguration can be performed fast.

<Design Technique

Now, the design technique that is used in this example to design the above-described reconfigurable optoelectronic circuit will be described below. Referring to FIG. 1, with this design technique, an operation of system design 21 and that of logical design 22 are conducted according to the requirement specification 20 and a net list 10 of the gate level is output. Assume that the technique is applied to an image processing feature that is to be added to a video signal decoder. As described earlier, a net list 10 of the gate level is obtained in the logical design step 22 by describing it at the RTL (register transfer level), using the hardware description language, and carrying out a logical synthesis, using a logical synthesis tools.

Figure 7:
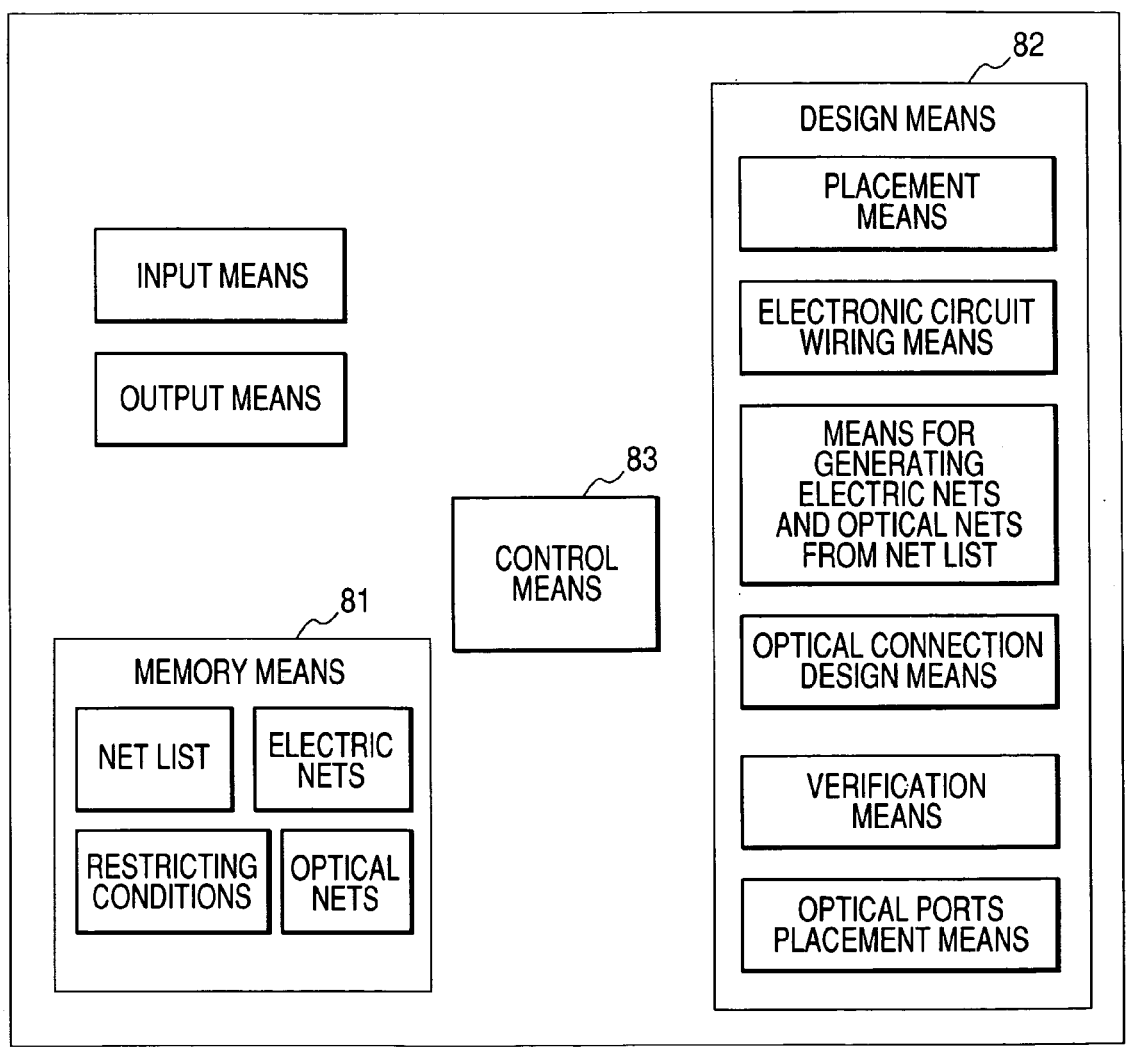
FIG. 7 is a schematic illustration of a device for designing an optoelectronic circuit according to the invention, showing the configuration thereof.

Then comes an optoelectronic design step 11 that characterizes the present invention and is conducted according to the net list 10. A device for designing an optoelectronic circuit as shown in FIG. 7 is used for the design. The device for designing an optoelectronic circuit comprises an input/output means, a memory means 81, a design means 82 and a control means 83.

The memory means 81 operates to store net lists, electric nets, optical nets, various design parameters, design results, intermediary design results, design times, feature specifications and design restrictions that are to be used for requirement specifications. The input/output means allows data of the above-described types to be externally input and outputs the design result and the result of evaluation to the outside. The design means 82 includes a means for generating electric nets and optical nets from a net list, an optical port arrangement means, an electronic circuit layout design means (including an arrangement means and wiring means), an optical connection design means and a verification means. The control means 83 controls the entire design means 82. In this example, the design means 82 and the control means 83 are installed in a general purpose computer as computer programs (software).

Figure 2:
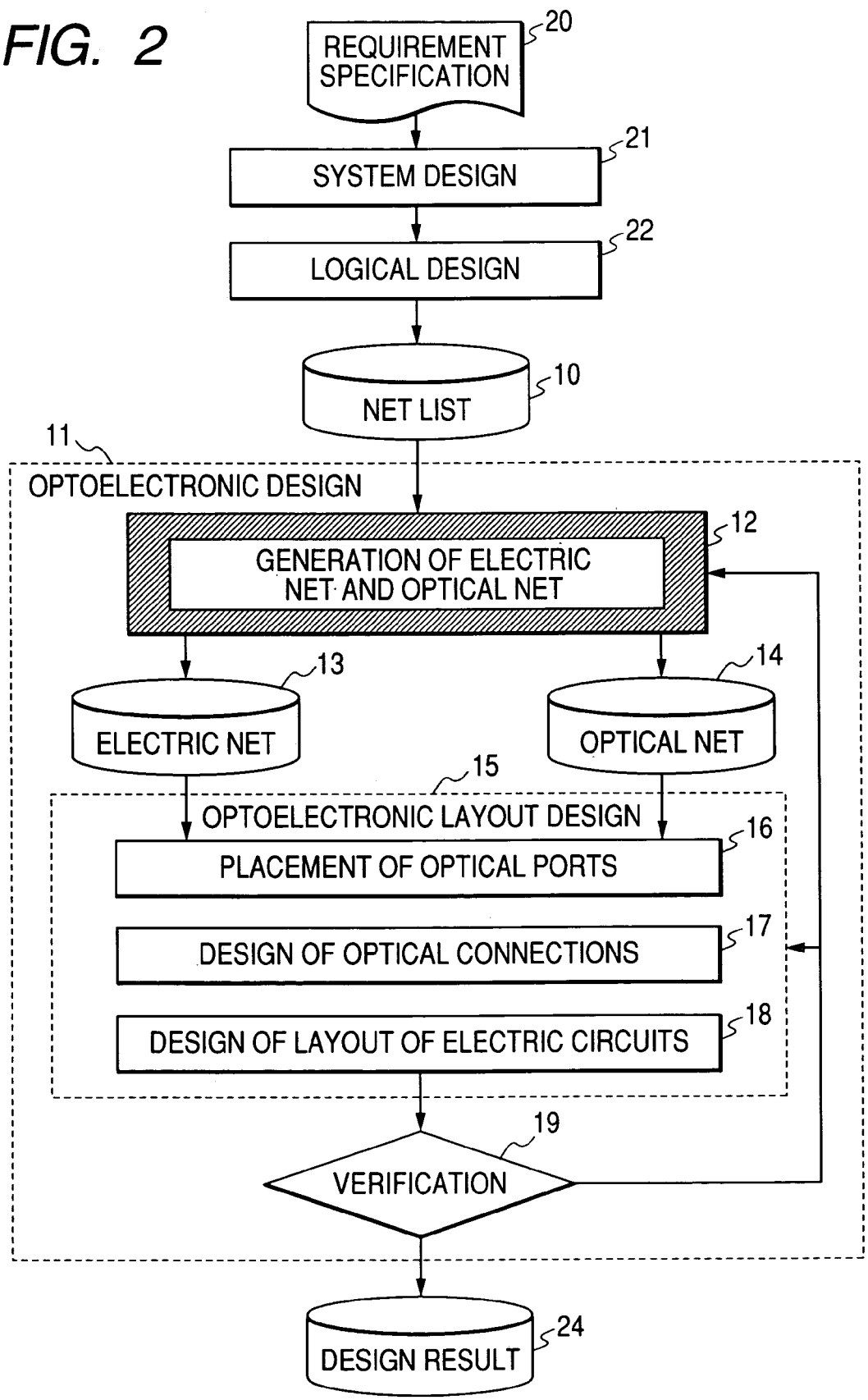
FIG. 2 is a flow chart for designing an optoelectronic circuit according to the invention, illustrating the optoelectronic design in greater detail.

FIG. 2 is the flow chart for designing an optoelectronic circuit that is used in this example. Referring to FIG. 2, firstly electric nets 13 and optical nets 14 are generated from the net list 10 according to the specification (restricting conditions) of the above-described reconfigurable optoelectronic circuit. A major restriction is that the number of optical ports in the optical module is nine as described above. The positions of the optical ports are fixed.

In this example, sites that correspond to fan outs are extracted from the net list and optical nets are assigned to those sites with priority when generating optical nets and electric nets. Fan outs are connected by broadcast optical connections in the flexible optical circuit. For example, three sites of
   node 1=>node 2
   node 1=>node 3
   node 1=>node 4 in the net list are reduced to a single 1:3 connection and optical nets are assigned in the following manner.
   port 1=> port 2, port 3, port 4

In this way, three electric nets can be omitted by using four optical ports. Since the optical module of this example has nine ports, it is possible to assign other nets to optical nets.

Then, the operation of optoelectronic layout design 15 is conducted on the basis of the electric nets and the optical nets. Referring to FIG. 2, the operation of placement of optical ports 16 is firstly conducted and then the operation of electronic circuit layout design (arrangement and electric wiring of electronic circuits) 18 and that of optical connection design 17 are conducted.

The placement of optical ports 16 is designed by taking both the optical circuits and the electronic circuits into consideration. The optical ports are distributed as much as possible so that the total distance of optical connections, or the distance between the signal transmitting optical port and the signal receiving optical port, may become long. As for the above-described optical net (port 1=>port 2, port 3, port 4), a port corresponding to [1,1] and a port corresponding to [1,3], [3,1] and [3,3] are respectively selected as signal transmitting optical port and signal receiving optical port (see FIG. 5A).

Subsequent to the operation of placement of optical ports 16, the operation of electronic circuit layout design 18 and that of optical connection design 17 are conducted respectively on the basis of electric nets and on the basis of optical nets. The min-cut technique is used for the placement of electronic circuits, whereas the channel wiring technique is used for the wiring operation. For the electric analysis, the signal delay of each net is computed from the wiring resistance and the wiring capacitance of the wires and a timing analysis is made on the basis of the delays. Additionally, the power consumption rate is evaluated. Still additionally, the total length of electric wires is computed from the outcome of the operation of electronic circuit layout design.

When designing optical connections, additionally, the mode of transmission of light and the angle of radiation of light at the signal transmitting optical port are determined. In this example, light emitting sections are selected to produce the most effective result in view of the direction and the angle of radiation of light at port [1,1] and the position of the signal receiving port. More specifically, two light emitting sections are selected from the light emitting sections in FIGS. 12A through 12C so as to radiate light in a right and downward direction in FIG. 5A in order to transmit the signal to the port corresponding to [1,3], [3,1] and [3,3] and driven. For the optical connection analysis, a light quantity analysis of analyzing the quantity of light that is used for optical connections, a transmission rate analysis based on the light quantity analysis and a delay analysis are made.

Subsequently, an operation of verification 19 is conducted to see if the design result satisfies the requirement specification (circuit speed, circuit area, power consumption rate). In the timing verification, an analysis is made by taking both the delays of the electric nets and those of the optical nets into consideration. While the circuit can be redesigned when problems are detected, it is not necessary to do so in this example.

Then, the connections in the insides of the FPGAs and the inter-FPGA electric connections are altered, or reconfigured, on the basis of the design outcome (output information) 24, or the configuration data.

(Reference Design 1)

A different technique is used in the step of generating electric nets and optical nets for Reference Design 1. While four ports are used as in this example, 1:1 connections are used for optical nets and the number of electric nets is reduced by two. More specifically, the sites of
   node 11=>node 12
   node 13=>node 14 in the net list are left unchanged and optical nets are assigned in the following manner.
   port 11=>port 12
   port 13=>port 14

The techniques of the other steps of this example are also used for the corresponding steps of Reference Design 1.

(Reference Design 2)

The technique of placement of optical ports that is used in this example is not necessarily a preferably one from the viewpoint of the optical module alone because of the long transmission distance. Therefore, in Reference Design 2, optical ports are arranged so as to optimize the efficiency of the optical module alone. In this case, a port that corresponds to [2,2] and a port that corresponds to [1,2], [1,3] and [2,3] are selected from a similar optical net respectively as signal transmitting optical port and signal receiving optical port so as to reduce the distance between the signal transmitting optical port and the signal receiving optical port. The techniques of the other steps of this example are also used for the corresponding steps of Reference Design 2.

Some of the characteristics of the circuits reconfigured according to the respective designs are listed below.

|  | operating speed | power consumption rate |
|---|---|---|
| Example 1 | 120 MHz | 0.7 W |
| Reference Design 1 | 30 MHz | 0.75 W |
| Reference Design 2 | 75 MHz | 0.65 W |

It will be seen that the circuit designed by the design technique of this example performs excellently (in terms of operating speed). The circuit designed by the design technique of this example is dimensionally smallest (in terms of the number of gates used for the FPGAs).

Particularly, it will be seen that the performance of the circuit of this example is improved if compared with that of the circuit of Reference Design 1 because it is designed so as to reduce the number of electric nets when generating optical nets. Additionally, the time required in this example for the operation of electronic circuit layout design is short if compared with Reference Design 1. In other words, an excellent result is obtained from the entire design of the optoelectronic circuit because electric nets and optical nets are generated so as to reduce the number of electric nets in the design of this example.

Still additionally, it will be seen that the performance of the circuit of this example is improved if compared with that of the circuit of Reference Design 2 because optical ports are arranged in a distributed manner. More specifically, it is found that the optoelectronic circuit is optimally designed by sacrificing the design of the optical module alone. Still additionally, the time required in this example for the operation of electronic circuit layout design is short if compared with Reference Design 2.

The optoelectronic circuit of this example provides an excellent design result as a whole because optical ports that operate as interfaces of optical circuits and electronic circuits are placed with priority for the design. Additionally, the total length of electric wires of this example is shorter than that of electric wires of Reference Design 2 by 30%. Thus, it will be seen that placing optical ports so as to reduce the total length of electric wires is highly effective.

Thus, the design technique of this example can optimize not only the design of the electric circuits and that of the optical circuits but also the design of the optoelectronic circuit as a whole. The optoelectronic circuit designed in this way maximally exploits the potential of the hardware in terms of performance and shows a high cost performance effect. Additionally the design of this example is characterized by a high reliability, a high reproducibility and easiness of reutilizing the design assets. While an optoelectronic circuit having flexible optical circuits provides the advantage of a high degree of freedom of optical connections, it accompanies difficulties for optimum design because of the wide choice due to the high degree of freedom. However, a satisfactory design can be achieved by using the above-described design technique.

Since the number of optical ports of this example is made as small as nine and the design is simplified for the purpose of simplification, the mode of optical connection and the placement of optical ports do not require any automatic design process. However, the design will become widely variable and it may be difficult to achieve an optimum design as the number of optical ports increases. Even in such a case, the design technique of this example can be used to design a highly reliable optoelectronic circuit in a short period of time. Particularly, the use of automatic design process will become preferably in such a case.

Meanwhile, FPGAs were used as reconfigurable electronic circuits in this example. However, the present invention is by no means limited thereto. A reconfigurable electronic circuit is required only to comprise logical elements 201 whose logical feature is alterable and an electric connection network that can alter the interconnections of the logical elements 201 as shown in FIG. 5B. Examples of logical elements 201 typically include LUTs (lookup tables), each having an input/output truth table for the logical function to be realized in a RAM and being adapted to produce an output signal for a combination of inputs. Alternatively, they may be realized by using ANDs, NANDs, ORs, NORs, XORs, flip-flops, latches, registers, inverters, multipliers and/or circuits of combinations of any of these. Still alternatively, they may be realized by using operating units (processors) for arithmetic operations of integers, floating-points and/or functions.

The electric connection network is used to define the connections among the logical elements. For example, it may be formed by electric wires arranged in the form of matrix and switches in order to interconnect the logical elements that are also arranged in the form of matrix (see FIG. 5B). The switches are arranged at the connections of the logical elements and the electric wires or at the intersections of the wires arranged in the form of matrix. While the reconfigurable system of this example is formed by using only FPGAs, chips of ASICs, CPUs, DPSs and/or memories may alternatively be used. Then, it is possible to provide optical ports for the chips of ASICs and so on.

EXAMPLE 2

In this example, a circuit having ASICs (custom chips) along with FPGAs and memories for hardware is designed. As in the case of Example 1, the basic structure of the optoelectronic circuit of this example is illustrated in FIG. 6. A major restriction of this example is to use custom chips. Other restrictions for the hardware include that the maximum number of FPGA chips is four (4), that of electric wiring layers is ten (10) while the number of optical connection layers is one (1) and that of optical ports is sixteen (16).

The difference of scope of design between Example 2 and Example 1 will be described below.

While the details of the insides of the FPGAs and the optical module are variable in Example 1, the placement of the chips and the optical ports is fixed. More specifically, a predefined reconfigurable system which is an optoelectronic circuit comprising nine FPGAs and nine optical ports is optimally designed in Example 1. Additionally, the positions of the FPGAs and the configuration of the electronic circuit layers including the electric wiring layers and that of the optical connection layer including the number and the positions of optical ports are predefined.

In this example, the placement of ASICs and that of FPGAs are also design elements. Additionally, the positions and the type of optical ports and the configuration of the optical connection layer including the optical transmission medium are designed within the scope of restrictions in this example. The optical connection layer is based on a flexible optical circuit formed by applying a 2D optical waveguide as optical transmission medium. While the mode of optical connection of the optical connection layer is alterable (re-configurable) in Example 1, the ultimate mode of optical connection of this example is fixed. Additionally, it is within the scope of restriction in this example to form the opto-electronic circuit by burying a line waveguide 108 in part of the 2D optical waveguide 101 as shown in FIG. 13. It is also within the scope of restriction in this example to connect a plurality of optical ports to a single chip. On the other hand, the internal circuit of each ASIC is fixed in this example.

The design sequence of this example is substantially the same as that of Example 1. Mainly, the differences will be described below. In this example again, an operation of system design 21 and that of logical design 22 are conducted according to a requirement specification 20 as shown in FIG. 2. A technique similar to that of Example 1 is used down to the step of outputting a net list 10 of the gate level. However, since the inside design of the ASICs is already completed, they are handled as fixed blocks and the internal circuit of each ASIC is fixed.

Then, an operation of optoelectronic design 11 comes. Since the inside design of each ASIC chip is already completed, the chip placement, the inter-chip electric connections, the internal configuration of FPGA, the configuration of the optical connection layer and the inter-chip optical connections are designed in this step.

Firstly, in the step 12 of generating electric nets and optical nets, nets are generated so as to minimize the number of electric nets. The number of electric nets is reduced by assigning optical nets firstly to the parallel connection sites and secondly to the fan-out sites. When the parts of parallel electric wires are assigned to optical connections, a serializer is added to the transmission side optical port whereas a deserializer is added to the reception side optical port. Thereafter, it is verified if the contents of the net list 10 before the division and the sum of the electric nets 13 and the optical nets 14 logically agree with each other or not.

Thereafter, an operation of arrangement of optical ports 16 is conducted. While the positions of optical ports are fixed in advance in Example 1, it is possible to design the optoelectronic circuit so as to place optical ports respectively at any desired positions in this example. In view of the size (3×4 cm) of the optical transmission medium, optical ports are arranged in a distributed manner so as to increase the total distance of optical connections in this example. For this purpose, optical ports are placed particularly according to the following guidelines. Firstly, for the optical net that assigned fan-out signals to broadcast optical connections, optical ports are arranged in such a way that the signals may be broadcast with an angle as wide as possible.

For the optical net that turns parallel connections into serial connections for optical transmission, optical ports are arranged in such a way that signals are transmitted in a direction oblique relative to x-y electric wires in order to extend the transmission distance. Additionally, a restriction that no optical port should be placed within a 5 mm wide zone of the periphery of the optical transmission medium is provided. Due to this restriction, optical ports are placed below the chip and lengths of the electric wires connecting the chip and optical ports can be reduced.

Subsequently, the step of electronic circuit layout design 18 and that of optical connection design 17 follow. The step of electronic circuit layout design 18 and that of optical connection design 17 are similar to those of Example 1. However, for the configuration of optical ports, a library that shows different configurations including the one illustrated in FIGS. 12A through 12C and provides variations in terms of the number of light emitting elements, the structure of light scattering body and so on is prepared to allow a wide choice. Variations of light scattering body include conical ones and semispherical ones that scatter light uniformly in all directions as well as prismatic ones and polygonal pillar-shaped ones that scatter light in limited directions and ones having a structure of mirror or prism. For example, a semispherical light scattering body may be used at a port adapted to broadcast in all directions and a scattering body having the structure of a 45° mirror may be used to transmit light predominantly in a given direction.

Then, on the basis of the result of the operation of electronic circuit layout design 18, the placement of optical ports is subjected to minor corrections. In this process of minor corrections, it is only allowed to correct the position of each optical port only within an area with a half diameter of 5 mm from the original position. The minor corrections make it possible to reduce the wiring distance of the chip and each optical port and improve the reliability of optical connections. Particularly, as a result of improving the reliability of optical connections, it is possible to reduce cross talks and secure a sufficient transmission band.

In this example, it was found that the transmission speed is insufficient at part of the optical connections in the verification step 19. Those optical connections were then redesigned. More specifically, a line waveguide 108 is applied to the net part thereof. As a result, the optical connections became satisfactory to meet the specification.

In this example, a mask is prepared on the basis of the design result 24 obtained by the above-described design sequence and an optical connection layer and an electric connection layer are formed. Then, the layers are bonded together and chips are mounted thereon to produce an optoelectronic circuit having a configuration as shown in FIG. 6. Additionally, circuits are formed in the insides of the FPGAs by using the design result 24 to produce an optoelectronic circuit that is exactly according to the design.

Figure 8A:
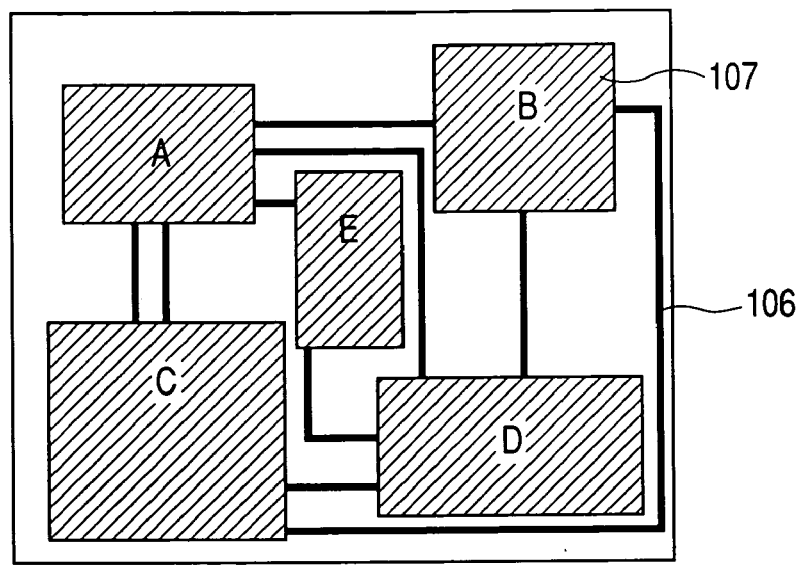
FIGS. 8A and 8B are schematic illustrations of the outcome of the design operation of Example 2.
Figure 8B:
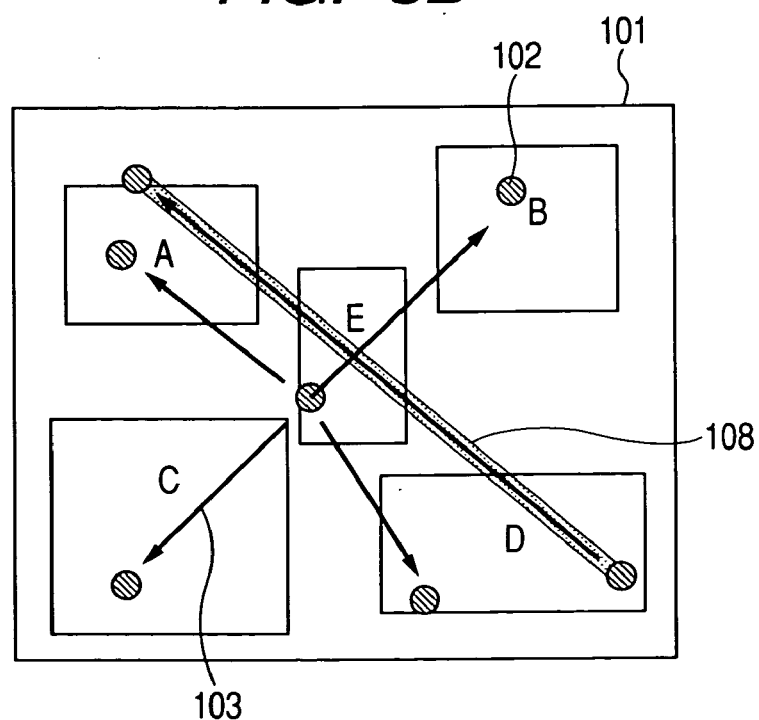

FIGS. 8A and 8B are schematic illustrations of the outcome of the design operation of Example 2. In FIGS. 8A and 8B, symbols A through E respectively denote semiconductor chips. In this example, A and D denote custom chips and B and C denote FPGAs, whereas E denotes a memory. FIG. 8A is a plan view and shows major electric wires 106 of the uppermost layer along with chips 107. FIG. 8B is a view of the optical connection layer 101 with optical ports 102 and chips 107 laid thereon. A line waveguide 108 is applied to the connection between A and D and a broadcast optical connection involving the 2D optical waveguide is used for the connections from E to other chips. An optical port having a triangular pillar-shaped optical coupler (mirror) is used for the transmission side optical port and the reception side optical port that are connected to the line waveguide 108.

On the other hand, an optical port having a semispherical optical coupler is used for the transmission side optical port that is adapted to broadcast. Note that the electric wires and the optical connections shown in FIGS. 8A and 8B are only part of the optoelectronic circuit of this example. They are shown to illustrate typical connections. The optoelectronic circuit may have optical connections where the radiation angle 104 is limited as shown in FIGS. 11A and 11B.

In this example again, priority is given to the placement of optical ports so that consequently it is possible to optimally design not only optical circuits and electronic circuit but also the entire optoelectronic circuit. In short, an optoelectronic circuit can be designed with an enhanced degree of reliability as a whole. It performs excellently for operation. Particularly, electric nets and optical nets are generated so as to reduce the number of electric nets so that consequently an excellent optoelectronic circuit can be designed as a whole. Additionally, the optoelectronic circuit can be optimally designed because optical ports are arranged so as to produce a mode of optical connections that cannot be realized by electric wires. The optoelectronic circuit designed in the above-described manner is adapted to fully exploit the restrictions of hardware and shows a high cost performance effect.

EXAMPLE 3

Figure 9A:
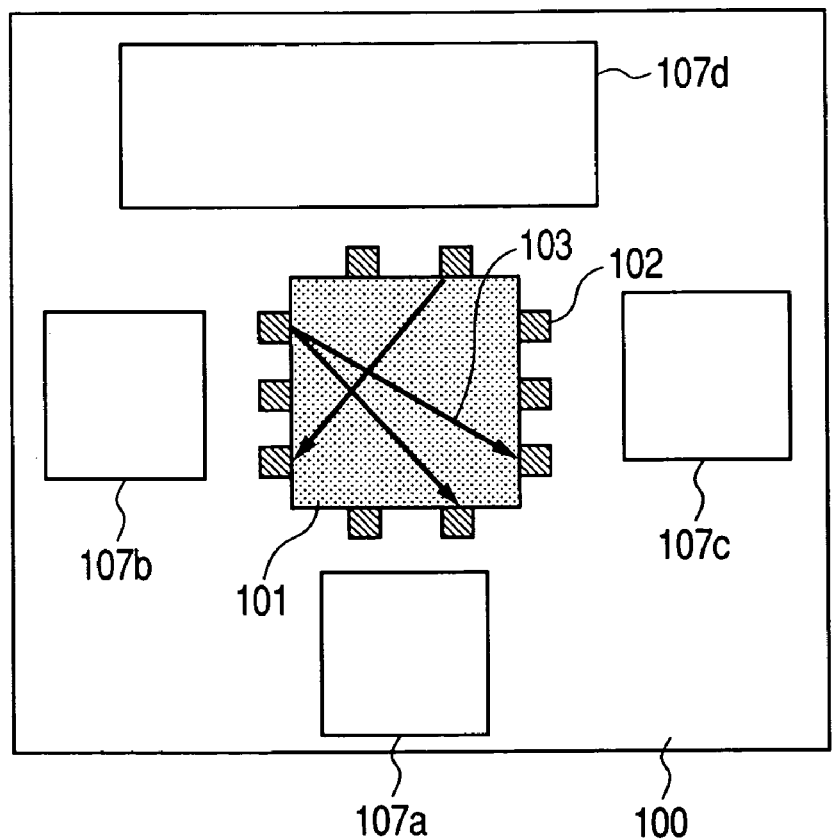
FIGS. 9A and 9B are schematic illustrations of the outcome (layout) of the design operation of Example 3.
Figure 9B:
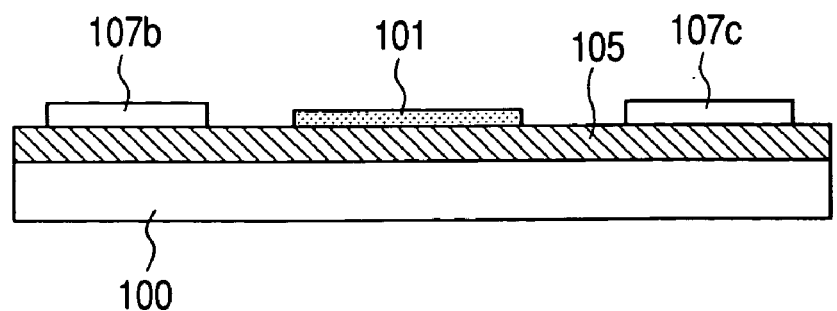

Hardware of the type illustrated in FIGS. 9A and 9B is used in Example 3. Referring to FIGS. 9A and 9B, there are shown a substrate 100, an optical transmission medium 101, optical ports 102, light 103 being transmitted, an electric wiring layer 105 and semiconductor chips 107 (107a through 107d) (while electric wiring layer 105 contains electric wires, they are not shown). In FIGS. 9A and 9B reference symbols 107a, 107b, 107c denote FPGAs and reference symbol 107d denotes a custom chip. FIG. 9A is a plan view and FIG. 9B is a cross sectional view that corresponds to FIG. 9A.

In this example, the optical module having an optical transmission medium 101 and optical ports 102 is arranged in an area of a part of the substrate and semiconductor chips 107 are arranged in the remaining area. As restriction, the optical module is handled as part and no semiconductor chip can be arranged there. Since an electric wiring layer is provided separately, electric wires can be arranged in intraplanar positions of the optical module. Other major restrictions for the hardware include that the number of FPGA chips is three, the number of custom chip is one, the number of electric wiring layer is four, the size of the optical transmission medium is 1 cm square, the number of optical connection layer is one and the maximum number of optical ports is 10 (see FIG. 9A for the placement of optical ports). Optical ports 102 are arranged along the edges of the optical transmission medium 101.

In the operation of optoelectronic circuit design of this example, the internal configuration of the FPGAs, the placement of the semiconductor chips and the optical module, the electric wiring among semiconductor chips, the optical connections among semiconductor chips, the configuration of the optical module and so on are designed.

Now, the design method of this example will be described by referring to FIG. 2. The steps down to the preparation of a net list 10 are the same as those of Example 1. In the step 12 of generating electric nets 13 and optical nets 14, they are generated so as to reduce the number of electric nets. The sites of fan-outs are assigned to optical nets with the first priority and those of parallel connections are assigned to optical nets with the second priority.

This example differs from Example 2 in that the position of the optical transmission medium is used as design item in the step of optoelectronic layout design 15. The operation of placement of optical ports 16 is conducted so as to maximize the total distance of optical connections. As a result, optical ports are arranged along the edges of the optical transmission medium in a distributed manner. In the step of electronic circuit layout design 18, the optical transmission medium is handled as a part having electric input terminals connected to optical ports and arranged and wired with other chips. The step of optical connection design 17 is the same as that of Example 2.

FIG. 9A shows the output of the design result of this example. As shown in FIG. 9A, the optical transmission medium 101 is arranged at or near the center of the substrate 100. FIG. 9A also shows the placement of optical ports 102 and the optical connections.

In this example again, priority is given to the placement of optical ports so that consequently it is possible to optimally design not only optical circuits and electronic circuit but also the entire optoelectronic circuit. In short, an optoelectronic circuit can be designed with an enhanced degree of reliability as a whole. It performs excellently for operation. The optoelectronic circuit designed in the above-described manner is adapted to fully exploit the restrictions of hardware and shows a high cost performance effect.

EXAMPLE 4

Figure 10A:
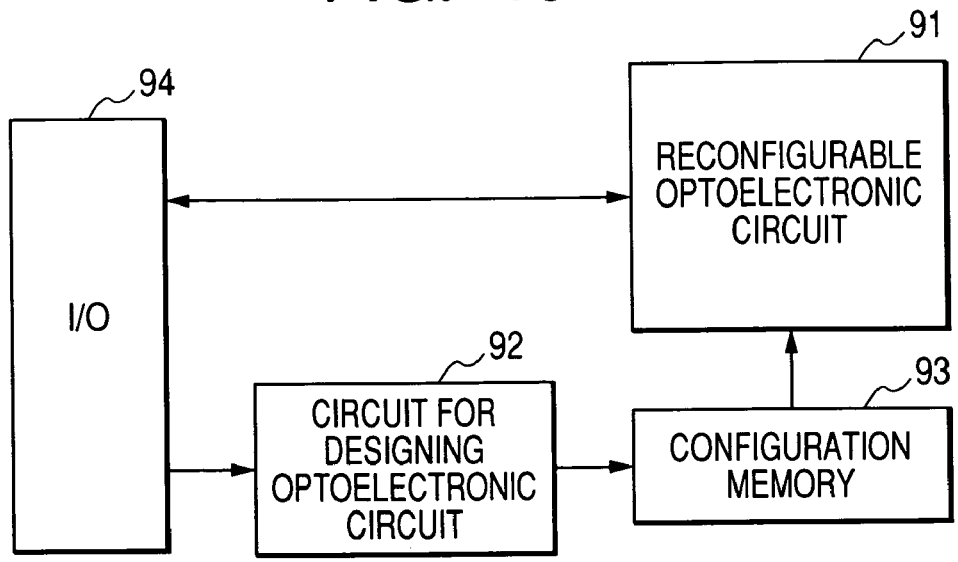
FIGS. 10A and 10B are schematic illustrations of the reconfigurable optoelectronic system (optoelectronic reconfiguration system) of Example 4, illustrating the configuration thereof.
Figure 10B:
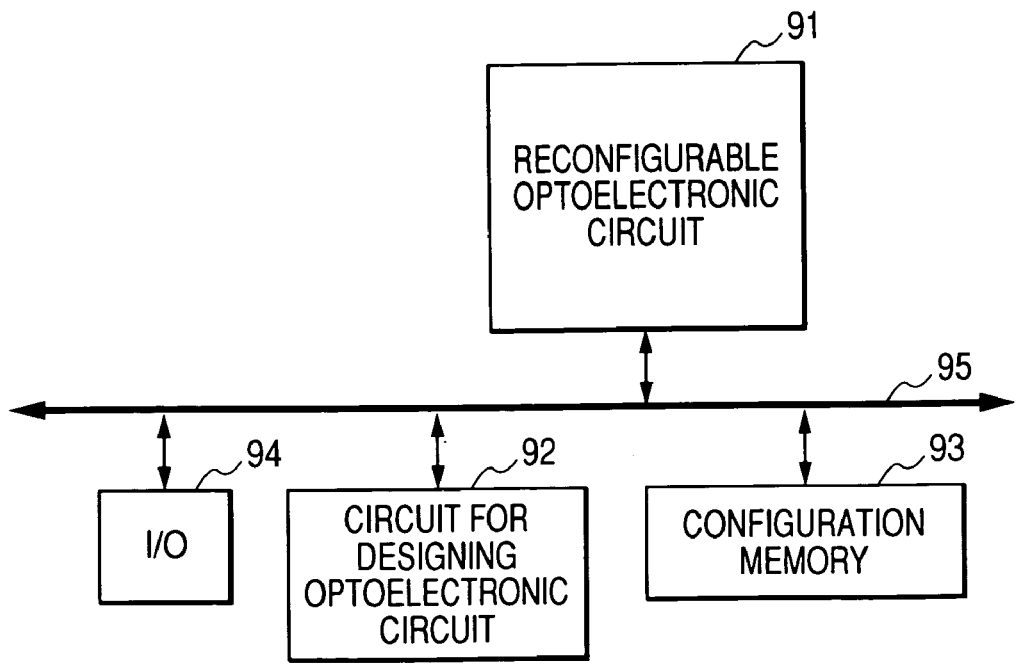

An optoelectronic system that can be reconfigured on a real time basis (optoelectronic reconfiguration system) is designed in Example 4. FIGS. 10A and 10B are schematic illustrations of the reconfigurable optoelectronic system of this example. As shown in FIG. 10A, it comprises a circuit (device) 92 for designing an optoelectronic circuit, a reconfigurable optoelectronic circuit 91, a configuration memory 93 and I/O (input/output means) 94.

The circuit 92 for designing an optoelectronic circuit has means as illustrated in FIG. 7 and operates in a manner as described earlier. In this example, these means are integrated into a single chip and installed as hardware.

In the reconfigurable optoelectronic system of this example, the circuit 92 for designing an optoelectronic circuit generates design data (or alters them) on the basis of the input data from I/O 94 and stores the design data in the configuration memory 93. The reconfigurable optoelectronic circuit 91 sequentially reads design data from the configuration memory 93 and reconfigures itself (alters the internal configuration thereof). The output from the reconfigurable optoelectronic circuit 91 is sent to the I/O 94. In this way, it is possible to optimize the internal configuration of the optoelectronic circuit 91 at any time on the basis of the input data from the I/O 94.

In this example, it is possible to design an optoelectronic circuit 91, integrating optical circuits and electric circuits, with a high degree of wiring freedom and it is also possible to reconfigure the optoelectronic circuit 91 on a real time basis. In other words, the system of this example can operate as a dynamic reconfigurable system that can freely alter the internal configuration of the optoelectronic circuit 91 on a real time basis.

Since the reconfigurable system of this example can optimally design a reconfigurable optoelectronic circuit 91 and reconfigure it in a short period of time in a system that requires reconfiguration of hardware at any time in response to the continuous change in the operating environment, it can suitably be used in a control system such as the control system of a robot.

While this example is described above by referring to FIG. 10A that illustrates the mutually connected components of the system, it is also possible to configure the system in such a way that the components are connected by a bus 95 as shown in FIG. 10B. The function of the memory 93 may be carried by the reconfigurable optoelectronic circuit 91 or the circuit 92 for designing the optoelectronic circuit.

EXAMPLE 5

In Example 5, a reconfigurable optoelectronic circuit is used for designing an optoelectronic circuit in which circuits are fixed. The designed circuit is verified and evaluated by means of the reconfigurable optoelectronic circuit used in Example 1 and a custom optoelectronic circuit is prepared on the basis of the output result.

Figure 14:
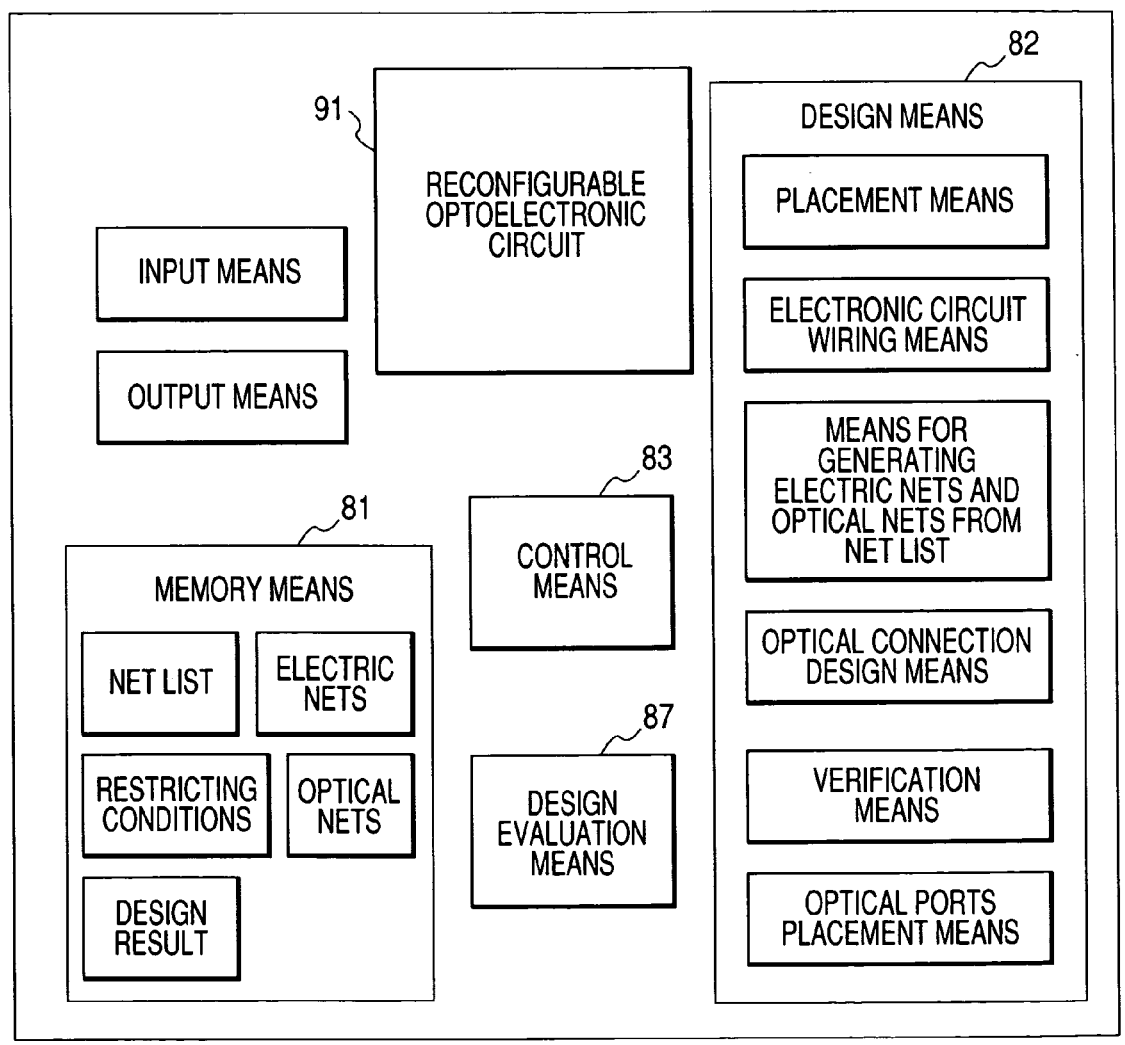
FIG. 14 is a schematic illustration of a design evaluation device for designing and evaluating the optoelectronic circuit of Example 5.

FIG. 14 is a schematic illustration of a design evaluation device used in Example 5. The design evaluation device comprises a design means 82 for designing an optoelectronic circuit and a design evaluation means 87 for installing the design result of the design means 82 in a reconfigurable optoelectronic circuit 91, operating it and evaluating the design result. In other words, the design evaluation device of this example comprises a design evaluation means 87 in addition to the device for designing an optoelectronic circuit (FIG. 7) that is used in Example 1. In this example, hardware similar to that of Example 1 is used for the reconfigurable optoelectronic circuit 91.

The performance of the reconfigurable optoelectronic circuit 91 is compared and its functions are verified by installing a plurality of design results output from the design means 82 of this design evaluation device in the reconfigurable optoelectronic circuit 91 and operating it. The design result that provides the most preferable performance is selected by referring to the requirement specification. It is referred to as the first design result. The design result that shows the largest value of (operation frequency)/(power consumption rate) is adopted in this example.

An operation of optoelectronic layout design is conducted once again, using the electric nets and the optical nets that produced the first design result and according to a different custom specification. Main restriction items include that electric nets are realized by an electric wiring layer and ASICs, or cell-based custom ICs. The physical specification of the electric wiring layer is the same as that of the reconfigurable optoelectronic circuit 91. While the optical connection layer has a configuration similar to that of the reconfigurable optoelectronic circuit 91, optical ports may be arranged arbitrarily.

The technique for the second optoelectronic layout design is similar to the technique used in Example 2. However, the insides of the ASICs are designed in the step of electronic circuit layout design in this example. Additionally, the circuit realized by a plurality of FPGAs may be installed in a single ASIC. The substrate is square but its size is a design item. The substrate size is defined to be as small as possible on the basis of the electronic circuit layout design. As a result, the placement of optical ports is dimensionally reduced, while maintaining their positional relationship. The result obtained in this stage is referred to as the second design result.

A new mask for ASICs, the electric wiring layer and optical connection layer is formed on the basis of the second design result and a custom optoelectronic circuit is prepared. While the reconfigurable optoelectronic circuit 91 can alter its circuit configuration, the configuration of the custom optoelectronic circuit is fixed. On the other hand, the custom optoelectronic circuit of this example can retrench the hardware such as the electric wires, the optical ports and the light emitting sections that have not been used if compared with the reconfigurable optoelectronic circuit 91 realized on the basis of the first design result so that it is possible to remarkably reduce the circuit area. Additionally, the internal configuration of each optical port such as the configuration of the optical coupling section and the arrangement and the number of the light emitting sections can be optimized in each optical port to improve the performance and reduce the dimensions of the circuit. This leads to an improved performance including an increase in the operation frequency and a reduction in the power consumption rate.

Thus, in this example, it is possible to realize a highly reliable high performance optoelectronic circuit by designing a custom optoelectronic circuit, using a reconfigurable optoelectronic circuit 91 as emulator. The method of designing an optoelectronic circuit of this example is more reliable than the design method that uses only simulation for verification. Particularly, when the circuit has large dimensions, it can curtail the design time and reduce the design cost.

EXAMPLE 6

In this example, a reconfigurable optoelectronic circuit is used as hardware and the above-described optoelectronic layout technique is applied to the automatic design of the circuit. The reconfigurable optoelectronic circuit as used herein is a circuit where reconfigurable electronic circuits (FPGAs) as shown in FIG. 5A and flexible optical circuits using planar or two-dimensional (2D) optical waveguides, which will be described in greater detail hereinafter, coexist as mixture.

Reconfigurable electronic circuits including FPGAs tend to require longer time and higher cost for optimizing the design as a result of raising the scale and the degree of integration leading to the increased influence of electric wiring delay that comes to intervene. On the other hand, systems that need to be reconfigurable on a real time basis are required to be designed in a short period of time. Additionally, while techniques of electrically connecting a plurality of FPGAs are being used for the purpose of scaling up, inter-chip electric wiring is fixed wiring that lacks flexibility so that severe restrictions are imposed for a plurality of chips to operate as reconfigurable circuits.

The reconfigurable optoelectronic circuit of this example dissolves the above problems by interconnecting FPGAs by way of flexible optical circuits. A flexible optical circuit shows a remarkably high degree of freedom of connection because it is intrinsically adapted to complete couplings (coupling characteristics that allow to realize free optical connections among optical ports) and multi-cast transmissions. Due to these properties, it is possible to reconfigure a plurality of chips with an enhanced degree of freedom by connecting FPGAs by way of flexible optical circuits. Thus, an optoelectronic circuit that is formed in this way is a reconfigurable circuit that can operate at high speed and has flexibility in addition to being a large scale circuit. Additionally, such an optoelectronic circuit can alleviate the problem of delays of RC signals in the intra-chip wires and that of EMIs as a result of using optical connections so that it can be realized as a reconfigurable circuit that is of large scale and operates at high speed.

While an optoelectronic circuit having flexible optical circuits provides the advantage of having a remarkably high degree of freedom for optical connections, it also provides a wide choice of alternative designs that makes it rather difficult to realize an optimum design. From this point of view, development of sophisticated design techniques is desired particularly for optoelectronic circuits using flexible optical circuits. Therefore, the design technique of the present invention that is adapted to realize a highly reliable optimum design can be suitably applied to reconfigurable optoelectronic circuits, which will be described in greater detail hereinafter.

<Hardwire>

Firstly, the hardware, which is a reconfigurable optoelectronic circuit, of this example will be described in detail by referring to FIGS. 5A, 5B and 6. FIGS. 5A, 5B and 6 are schematic illustrations of the configuration of a reconfigurable optoelectronic circuit that is used in this example. FIGS. 5A and 5B shows a two-dimensional layout of the circuit and FIG. 6 is a cross sectional view of the circuit. FIG. 5B shows a detailed description of a single FPGA in FIG. 5A. Referring to FIGS. 5A, 5B and 6, there are shown a substrate 100, a two-dimensional (2D) optical transmission medium (2D waveguide) 101, optical ports 102 (102a to 102c) for outputting and/or inputting light, light 103 being transmitted through the optical transmission medium 101, electric wiring layers 105 (105a, 105b), electric wires 106, reconfigurable electronic devices (logical block) 107 (107a to 107c), logical elements 201, intersections 206, connecting sections 207 and a matrix wiring 208 that is an electric connection network. As shown in FIG. 5A, a plurality of (nine) FPGAs having 400 thousands gates are mounted as reconfigurable electronic circuits 107 and interconnected by way of the the electric wires 106 and the optical transmission medium 101, which operates as flexible optical circuit.

As shown in FIG. 6, an electronic module having FPGAs and electric wiring layers 105 and an optical module having a 2D waveguide 101 and optical ports 102 are laid one on the other and bonded to each other to form a layered structure. Additionally, the electric wiring layers 105 having electric wires 106 for connecting chips 107 are laid one on the other and compactly mounted. While the optical transmission medium 101 may have any desired number of layers, it is realized as a single layer medium in this example. The FPGAs are located close to each other and connected to each other by 32 electric wires in the electric wiring layers 105.

Additionally, as shown in FIG. 6, the optical transmission medium 101 is sandwiched by the electronic wiring layers 105a, 105b and the optical ports 102 are arranged near the interface of the electric wiring layer 105a and the optical transmission medium 101. The substrate 100 has a size of 3 cm square. As shown in the plan view of FIG. 5A, there are a total of nine FPGAs 107 ([1,1] through [3,3]) that are provided with respective optical ports 102. In other words, each FPGA 107 is provided with a single optical port 102. In this way, the FPGAs 107 are connected to the respective optical ports 102 that operate to transmit and/or receive optical signals with the optical transmission medium 101 (the optical ports are not shown in FIGS. 5A and 5B).

As pointed about above, the optical transmission medium 101 is a 2D optical waveguide, which is formed by coating a 100 µm thick polycarbonate substrate (refractive index: 1.59) with fluorinated polyimide (refractive index: about 1.52) as clad. With the optical connections that are established in this way, the electric signal output from an FPGA 107 is converted into an optical signal by the corresponding optical port 102, which optical signal is then transmitted through the optical transmission medium 101, which is a 2D optical waveguide, and then converted back into an electric signal by some other optical port 102 so as to be input to the corresponding FPGA 107.

In this way, the FPGAs are interconnected by way of both electric wires and flexible optical circuits. Whether the electric wire or the flexible optical circuit is used by an FPGA for signal transmission is determined by selecting the connection terminal in the signal transmitting FPGA.

As described above, the optoelectronic circuit of this example is adapted to alter not only the internal configuration of each of the electronic circuits (FPGAs) 107 but also the configuration of the entire circuit by freely changing the inter-FPGA optical connections. That is, the inter-FPGA connections through flexible optical circuits can be reconfigured.

Now, the configuration of a flexible optical circuit will be described below.

A flexible optical circuit is a circuit adapted to transmit information by using light as carrier. It can freely alter the mode of transmission of information among optical ports 102 by way of an optical transmission medium 101. In this example, the flexible optical circuit comprises the 2D waveguide (planar optical waveguide) 101 and the optical ports 102.

In a flexible optical circuit, it is possible to arrange optical ports at any desired positions in the two-dimensional waveguide and two-dimensionally transmit optical data from an optical port to another optical port that are arranged at desired respective positions. For example, it is possible to propagate light 103 with any appropriate radiation angle (104a and 104b) in intra-planar directions of the optical transmission medium 101 as shown in FIGS. 11A and 11B. Note that, in this example, nine optical ports 102 are used in positions fixed in advance. Each optical port can operate for broadcast transmission of optical signals to all other optical ports. As pointed out above, the electric signal from an FPGA 107 is converted into an optical signal at the corresponding optical port 102 and, after being propagated through the optical transmission medium 101, converted back into an electric signal by some other optical port 102 so as to be input to the corresponding FPGA 107.

The optical ports 102 have a feature of transmitting and/or receiving optical signals. More specifically, each optical port 102 has an optical output section for converting an electric signal into an optical signal and/or an optical input section for converting an optical signal into an electric signal. The light emitted from the light emitting element that operates as optical output section of the optical port that transmits a signal is propagated through the optical transmission medium 101 and input to the light receiving element that operates as optical input section of the optical port that receives the signal. As the signal is converted into an electric signal by the signal receiving optical port, the signal is transmitted from one signal transmitting optical port to another signal receiving port to operate as optical circuit.

A surface emission laser may typically be used for the optical output section. More specifically, the electric signal is converted into an optical signal as the logic signal (e.g., of 3.3V) of an FPGA 107 that is input to the optical port 102 thereof is applied to the light emitting element so as to produce a forward bias. The light emitting element may typically be a 0.85 µm band surface emission laser (VCSEL). A VCSEL has a standard characteristic of producing an optical output of 3 mW when the drive current is 3.0 mA.

As shown in FIGS. 11A and 11B, optical ports 102 are arranged so as to be able to propagate light with various intra-planar radiation angle and radiation directions. To realize this capability, a mirror having a profile of a quadrangular prism as shown in FIG. 12A may be used as optical coupler 301 for optically coupling an optical port 102 and the optical transmission medium 101. In the instance of FIG. 12A, a beam of light 303 from the light emitting element 306 of the optical output section 305 is irradiated from above to the top of the prism mirror 301 and reflected transversally so as to be coupled to the optical transmission medium 101. When a beam of light from the light emitting element 306 irradiates light irradiation spot 302 on a slope of the prism 301 as shown in FIG. 12B, light 304 is propagated with an intra-planar radiation angle of about 90°. When beams of light irradiate four slopes as shown in FIG. 12C, light 304 is propagated with an intra-planar radiation angle of 360°. Thus, when beams of light irradiate two or three slopes of the prism 301, light 304 is propagated with an intra-planar radiation angle of 180° or 270°, whichever appropriate. Since the slopes of the prism are diffusion surfaces, light is uniformly propagated over the entire radiation angle.

In the instance of FIGS. 12A through 12C, a total of five light emitting elements 306a, 306b, 306c, 306d, 306x including those for the respective slopes and one for the center are arranged above the prism mirror 301 in such a way that beams of light from the respective elements irradiate the respective slopes. With this arrangement, the angle of radiation can be selected by selecting one or more than one light emitting elements. For example, when the central light emitting element 306x is selected, light is propagated with an intra-planar radiation angle of 360°. When one of the light emitting elements 306a through 306d is selected, light is propagated with an intra-planar radiation angle of 90° in the direction corresponding to the selected light emitting element. Light is propagated with an intra-planar radiation angle of 180° when two of the light emitting elements 306a through 306d are selected, where as light is propagated with an intra-planar radiation angle of 270° when three of the light emitting elements 306a through 306d are selected and with an intra-planar radiation angle of 360° when all the four light emitting elements 306a through 306d are selected. In this way, the angle and the direction of radiation can be switched by arranging a plurality of light emitting elements at the optical port 102 and selecting one or more than one light emitting elements to be driven. The light emitting elements to be driven can be selected by means of the corresponding FPGA 107.

While a prism mirror is used and the angle and the direction of radiation can be defined on the basis of a unit of 90° in the above-described optical port, the configuration of the operation port is by no means limited thereto. An optical port that can substantially broadcast in all directions of 360°, an optical port that can propagate light with a relatively small radiation angle that substantially corresponds to the radiation angle of the light emitting elements so that light may be propagated substantially as a beam or an optical port that can propagate light in many different directions may alternatively be used.

The optical signal that is propagated through the optical transmission medium 101 is taken in by the light receiving element of the corresponding optical port 102 and converted into an electric signal. An Si-PIN photodiode may be used for the light receiving element and connected to the electronic circuit 107. The electronic signal obtained by the conversion is taken into the inside of the electronic circuit 107 that is typically an LSI located nearby and processed as input electric signal. If an preamp for amplifying the electric signal is integrally arranged with the light receiving element, the signal voltage can be restored to the CMOS compatible level. When an optical coupler (see optical coupler 301 in FIGS. 12A through 12C) having a conical profile is used in the light receiving section, it is possible to receive light from all directions of 360° of the 2D optical waveguide 101. In this way, the feature of a flexible optical circuit can be realized to make it possible to establish an optical connection between optical ports by using optical ports and a 2D optical waveguide and freely propagating light in the optical waveguide.

While an optical port that can receive light from all directions of 360° of a 2D optical waveguide is described above, an optical port may alternatively be provided with a plurality of light receiving sections where it can receive light only from a limited direction so that the optical signal it receive may be selected by selecting one of the light receiving sections as in the case of the optical port for signal transmission.

As described above, in this example, the circuit connections are altered (reconfigured) by altering the angle and the direction of radiation of light from the signal transmitting optical port to select the destination of signal transmission or by altering the light receiving direction of the signal receiving optical port. Alternatively, it is possible to reconfigure the circuit by selecting data at the signal receiving optical port. For example, the signal transmitting optical port may operate for broadcast transmission by using packet signal for the information to be transmitted and assigning addresses to packets. Then, the information can be transmitted to the target signal receiving port as the signal receiving optical port selects packets by means of the addresses assigned to them.

Thus, a flexible optical circuit is a circuit that can realize a two-directional complete coupling at an optical port. Additionally, it can realize an 1:N multicast communication and an N:M communication. Still additionally, it can freely alter the connections of 1:1 multicast communication, those of 1:N communication and those of N:M communication so that 1:1 transmission 1:N transmission and N:M transmission can be switched (reconfigured) freely. The data transfer rate between optical ports of the flexible optical circuit of this example is maximally 1 Gbps and typically 500 Mbps.

The use of a 2D waveguide is preferable for the flexible optical circuit if compared with a line waveguide and a free space connection. The reason for this will be described below. Firstly, it may be conceivable to use an optical circuit comprising optical fibers and a line waveguide. However, then fixed line wiring has to be used to reduce the degree of freedom of wiring. To reconfigure an optical circuit with such an arrangement accompanies difficulties because a large number of optical switches are needed. Additionally, a line optical waveguide requires alignment of optical axes of the order of several microns to tens of several microns, which is very difficult. Still additionally, such an optical waveguide requires micro-machining and it is difficult to prepare such an optical waveguide.

Furthermore, by using a 2D waveguide, it is possible to mount optical devices (light emitting elements and light receiving elements) at any desired positions so that information can be conveyed between any positions. Still additionally, optical alignment will be realized with ease when optically coupling optical devices and a waveguide layer. Thus, the use of a 2D waveguide for a flexible optical circuit provides advantages including that a circuit board can be formed with ease at low cost because the 2D waveguide has a simple configuration and that the optical circuit can be reconfigured simply by controlling the optical ports that are basically light input/output sections as will be described in greater detail hereinafter.

On the other hand, since a line waveguide can transmit signals at high speed, it may be buried in a 2D optical waveguide to bear predetermined fixed connections. For example, as shown in FIG. 13, a line waveguide 108 may be provided to connect chips 107 that are remote from each other. While a system of propagating light in a free space that operates as optical transmission medium has been proposed and such a system provides a high degree of wiring freedom, it is accompanied by a problem of large overall dimensions. The arrangement using a flexible optical circuit that comprises a 2D optical waveguide can realize a circuit board that is thin and wired highly densely.

In a reconfigurable optoelectronic circuit as described above, not only the circuit configuration of the inside of the FPGAs but also the optical connections of the flexible optical circuit is reconfigurable. The configuration data necessary for reconfiguration are information that is output depending on the design of the optoelectronic circuit.

The reconfigurable optoelectronic circuit of this example is adapted to reconfigure the entire circuit by reading configuration data from outside. The internal circuit design of the FPGA can be altered by rewriting the configuration data to reconfigure the electronic circuits (the connections in the insides of the FPGAs, the inter-FPGA electric connections) and further more it is possible to alter (reconfigure) the inter-FPGA connections that are realized by way of flexible optical circuits typically by selecting optical ports. More specifically, the angle and the direction of radiation are altered at each optical port according to the configuration data to reconfigure the optical circuits.

When reconfiguring the optoelectronic circuit, the circuit may entirely or partly be reconfigured. When a similar function is realized, it is preferable to partly reconfigure the circuit because the operation of reconfiguration can be performed fast.

<Design Technique>

Now, the design technique that is used in this example to design the above-described reconfigurable optoelectronic circuit will be described below. Referring to FIG. 2, with this design technique, an operation of system design 21 and that of logical design 22 are conducted according to the requirement specification 20 and a net list 10 of the gate level is output. Assume that the technique is applied to an image processing feature that is to be added to a video signal decoder. As described earlier, a net list 10 of the gate level is obtained in the logical design step 22 by describing it at the RTL, using the hardware description language, and carrying out a logical synthesis, using a logical synthesis tools.

Figure 18:
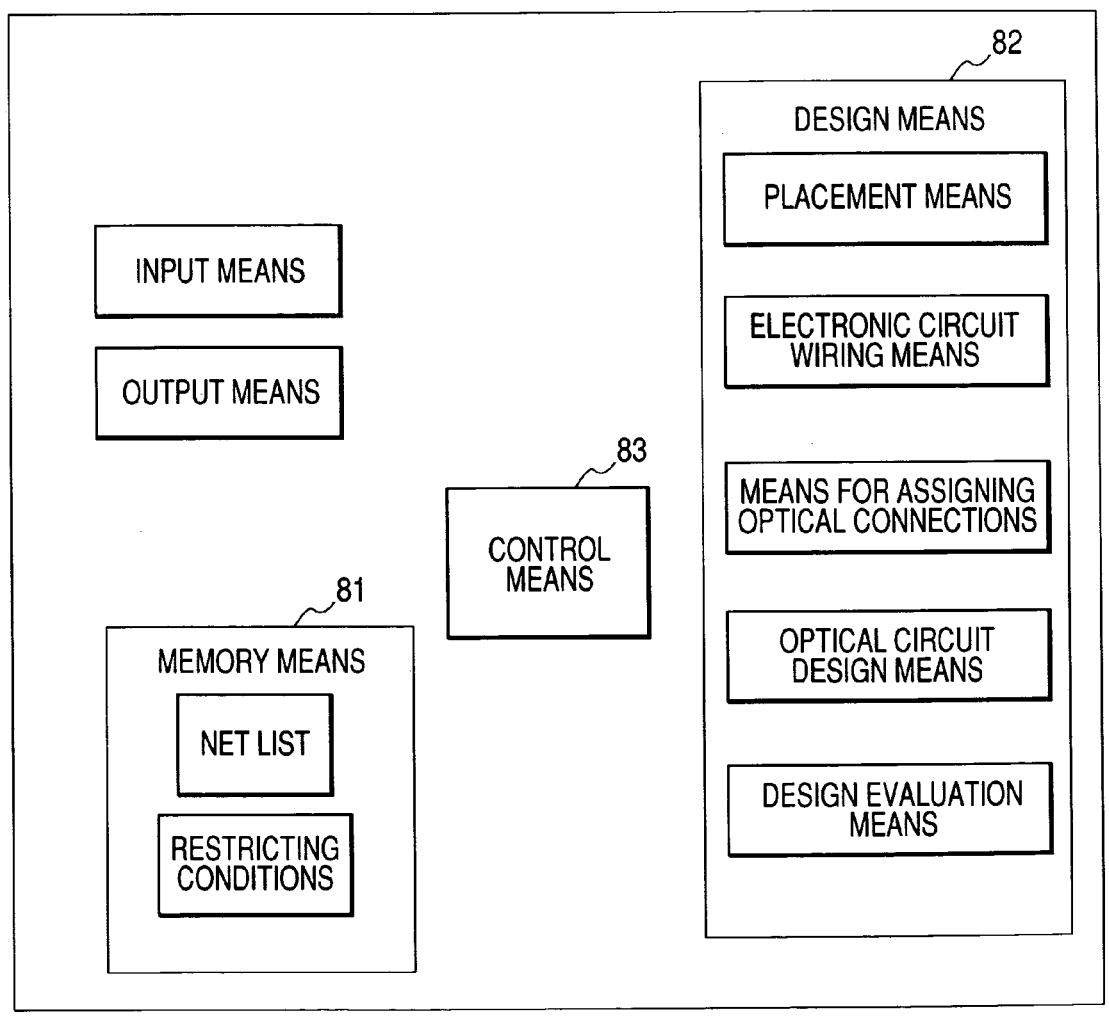
FIG. 18 is a schematic illustration of a device for designing an optoelectronic circuit according to the invention, showing the configuration thereof.

Then comes an optoelectronic design step 11 that characterizes the present invention and is conducted according to the net list 10. A device for designing an optoelectronic circuit as shown in FIG. 18 is used for the design. The device for designing an optoelectronic circuit comprises an input/output means, a memory means 81, a design means 82 and a control means 83.

The memory means 81 operates to store net lists, various design parameters, design results, intermediary design results, design times, feature specifications and design restrictions that are to be used for requirement specifications. The input/output means allows data of the above-described types to be externally input and outputs the design result and the result of evaluation to the outside. The design means 82 includes an electronic circuit layout design means (including an arrangement means and wiring means), an optical connection assignment means, an optical connection design means and a design verification means. The control means 83 controls the entire design means 82. In this example, the design means 82 and the control means 83 are installed in a general purpose computer as computer programs (software).

Figure 16A:
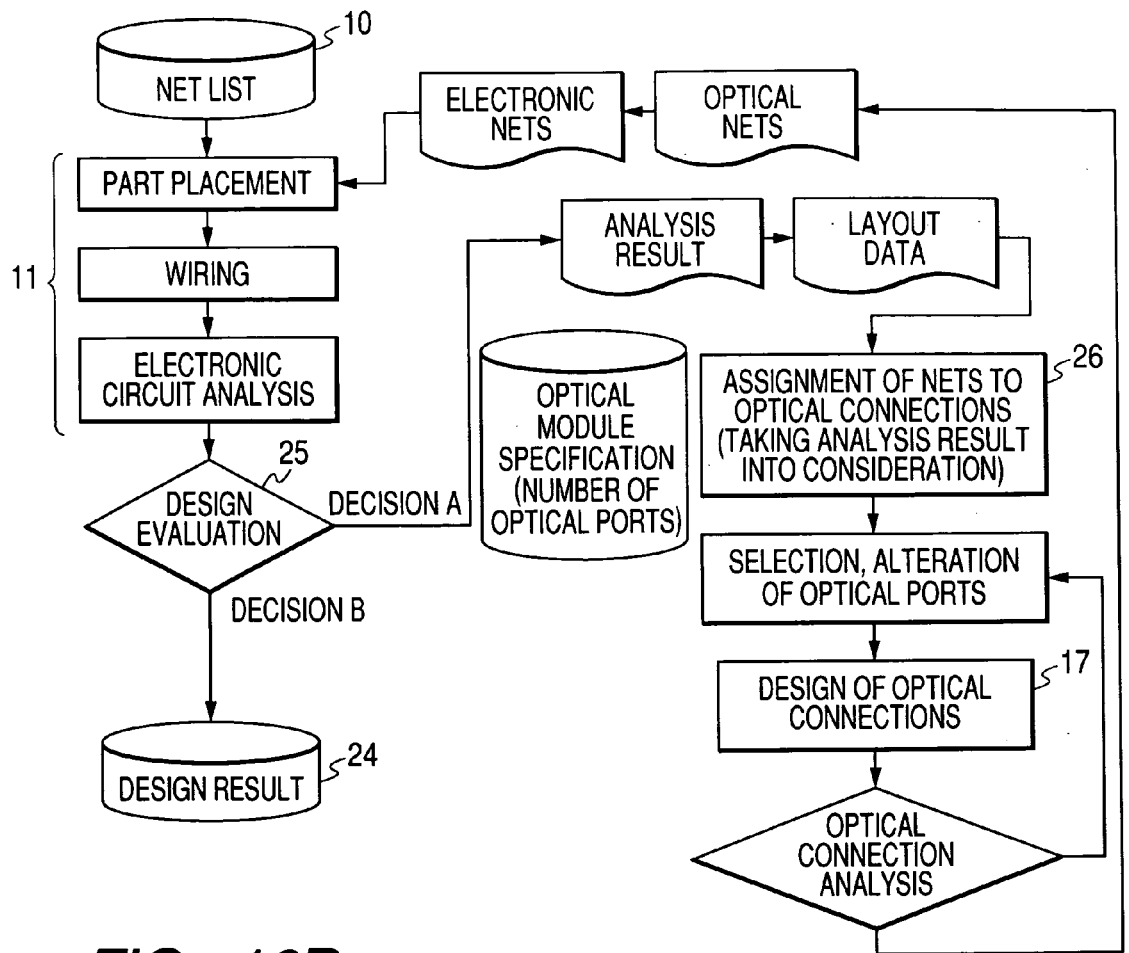
FIGS. 16A and 16B are flow charts for designing an optoelectronic circuit of Example 6 (optoelectronic layout section)

The design is realized in a manner as described below by appropriately using the above-described design means 82. FIG. 16A is a flow chart of the operation of optoelectronic layout design used in this example. To begin with, an operation of electronic circuit layout design is conducted for the first time. The layout design includes arrangement and electric wiring of electronic circuits and circuit analysis. Here, only electric wiring is used for the design under the restriction of not using optical connections. The min-cut technique is used for arrangement and the channel wiring technique is used for wiring. The maximum time spent for arrangement and electric wiring of electronic circuits is 3 minutes and, when the time passes, the operation proceeds to the next step with the preliminary result. For electronic circuit analysis, the signal delay of each net is computed from the wiring resistance of the wires themselves and the wiring capacitance and a timing analysis is made on the basis of the delays. Additionally, the power consumption rate is estimated.

Then, the design is evaluated. In this example, the following evaluation criteria are defined on the basis of the requirement specification. First evaluation criterion: The operation frequency is not smaller than 50 MHz. Second evaluation criterion; The power consumption rate is not larger than 0.8 W.

If the design result does not meet the evaluation criteria, decision A is made to proceed to the sequence of operation of optical connection in order to improve the design. If, on the other hand, the design result meets the two evaluation criteria (yes), decision B is made and layout information is output to terminate the design operation and also the fact that no optical connection is used. In this case, in view of effective utilization of hardware, it is preferable that the designer designs the circuit once again by using higher and more rigorous evaluation criteria. The design result of the first design using only electronic circuits did not meet the specification.

If decision A is made as a result of the design evaluation, the operation proceeds to the step of generation of optical connections. Before proceeding to the step, the outcome of the layout operation and that of the delay computations are stored so as to be used in the subsequent steps. In this example, part of the nets of the net list is assigned to generate optical connection nets and electric nets.

The following priority scheme of assignment to optical connections is used as guidelines in this example on the basis of the outcome of the above analysis (on the electric wiring delays and so on). A guideline having a smaller number has higher priority.

guideline 1: Nets connected to a node (starting point of net) having a high fan-out are assigned to optical connections guideline 2: Nets connected to a node having a high fan-in are assigned to optical connections.

guideline 3: A plurality of nets having the same starting point and the same terminating point, i.e. parts of parallel electric wires, are assigned to optical connections.

guideline 4: Nets showing a large electric wiring delay are assigned to optical connections.

guideline 5: Nets transmitting signals at high speed are assigned to optical connections.

guideline 6: Nets having a long wiring distance are assigned to optical connections.

guideline 7: Nets showing a large value of (straight line distance between nodes)/(wiring length) are assigned to optical connections.

When designing an optoelectronic circuit to which a flexible optical circuit is applied, it is preferable to give high priority to the guidelines 1 and 2 from the viewpoint of designing the optoelectronic circuit that can exploit the hardware (flexible optical circuit) features. Also, in view of the fact that long parallel electric wires can easily give rise to cross talks, nets having such configuration should be assigne to optical connectioned and other problem. Guidelines having lower priority have a better chance of being adopted in the optical net assigning step of a design session with an increased number of trials.

Then comes an operation of designing and analyzing optical connections. Here, an optical port for signal transmission and an optical port for signal reception are selected for the assigned optical nets and then the mode of optical transmission and the light radiation angle are determined for the optical port for signal transmission. While the circuit of this example does not have the feature of selecting the direction of receiving light for the optical port for signal reception, it is also possible to select the direction when the circuit has such a feature.

In the operation of optical port selection, optical ports located close to the transmission terminals of the net in the layout will be selected. Referring to FIGS. 12A through 12C, selecting the direction and the angle of radiation and hence the light emitting element(s) 306 to be used will be selected to maximize the effect by taking the position of the optical port for signal reception into consideration.

If necessary, electronic circuits selected from registers, flip-flops, serializers, deserializer and so on will be newly added to the peripheries of optical ports. At this time, what are added are actually added to electric nets. For example, when the parts of parallel electric wires are assigned to optical connections, a serializer and a deserializer may be added respectively to the optical port for signal transmission and the optical port for signal reception.

When analyzing optical connections, the quantity of light to be used for each optical connection may be analyzed and a transmission rate analysis and a delay analysis may be made on the basis of the outcome of the quantity of light analysis. After confirming that the optical connections are adapted to realize a desired data transmission, the design data for the optical connections are stored. When the design of optical connections does not operate well for optical nets, it is possible to alter the selection of optical nets.

Subsequently, the operation of electronic circuit layout design is conducted for the second time. Since part of the nets has already been assigned to optical connections unlike the first operation, the number of electric nets is reduced if compared with the number of electric nets that existed for the first operation. On the other hand, the number of optical ports, which are also parts, that of the wires leading to the optical ports and that of electronic circuits have been increased. Therefore, the outcome of the electronic circuit layout design will be different from that of the last time. A timing analysis is made by taking both the outcome of the delays of the electric nets and the outcome of the delays of the optical nets (including those of the added part) into consideration.

Figure 16B:
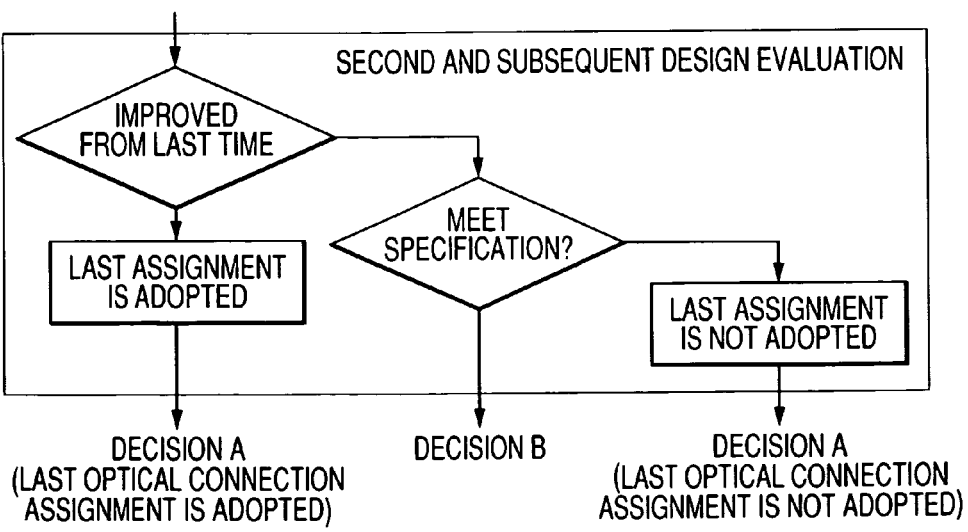

Subsequently, after the second operation of electronic circuit layout design, an operation of design evaluation is conducted for the second time. The second operation of design evaluation can be conducted by means of a technique similar to the one used for the first operation of design evaluation. More specifically, the sequence of optical connections is followed when decision A is made. On the other hand, layout information is output and the design operation is terminated when decision B is made. Note, however, in the second operation and the subsequent operations, the comparisons with the result of the preceding operation are additionally used to provide the following decision criteria (see FIG. 16B)

Decision A is made when the result shows an improvement relative to the last operation and the specification is met.

Decision A is made when the result shows an improvement relative to the last operation and the specification is not met.

Decision A is made when the result shows an aggravation relative to the last operation and the specification is not met.

Decision B is made when the result shows an aggravation relative to the last operation but the specification is met. Then, the last result is adopted and the design operation is terminated.

The result is determined to show an improvement when the value of (operation frequency/power consumption rate) is increased and an aggravation when the value is decreased.

If the result of design evaluation shows an improvement after the subsequent operation of the second or later optical net assignment session, the last assignment of optical nets is adopted once again and new optical nets are added thereto. If, on the other had, the result of design evaluation shows an aggravation, the nets added last time are omitted and the operation proceeds once again to the optical connection assignment session to try to connect other nets to light. Assignment guidelines similar to those used in the first operation will be used here.

The design is improved gradually by repeating the above-described sequence. In other words, the sequence of assigning part of the nets to optical connections, laying out of electronic circuits and evaluating the outcome of the layout is repeated for a number of times to realize an improved optimal design. The design operation may be terminated if the design evaluation does not show any improvement after repeating the sequence for ten or more than ten times as described hereinafter by referring to Example 7.

The table below shows exemplar results (including intermediary results) obtained as a result of a design operation using the design technique of this example.

In the table shown below, design 1 shows that the intermediary result produced after the first session of electronic circuit design indicates that specification is not met both in terms of operation speed and power consumption rate (the operation speed needs to be not smaller than 50 MHz and the power consumption rate needs to be not greater than 0.8 W). Design 1a shows the intermediary result produced after the second design evaluation including the evaluation for the use of optical connections. It will be seen that the operation speed is improved and the number of gates is decreased.

Design 1b shows the final design result produced after repeating the design evaluation session for 60 times. It will be seen that the specification is met both in terms of operation speed and power consumption rate.

Design 2 shows the result produced when an image processing algorithm is newly added to the application installed for Design 1. The circuits used for Design 1 are not corrected and only new parts are added in Design 2. Design 2a shows the result produced as a result of improving the circuit by using the state of Design 2 as initial state and repeating the sequence of optical net assignment, optical design and electronic circuit layout design.

|  | Number of gates used | Number of optical ports used | Operation speed | Power consumption rate |
|---|---|---|---|---|
| Design 1 | 2,000,000 | 0 | 25 MHz | 0.9 W |
| Design 1a | 1,000,000 | 3 | 100 MHz | 0.85 W |
| Design 1b | 1,200,000 | 5 | 130 MHz | 0.6 W |
| Design 2 | 1,600,000 | 4 | 95 MHz | 0.65 W |
| Design 2a | 1,500,000 | 7 | 110 MHz | 0.75 W |

From the above table, it will be seen that the design is made once unsatisfactory relative to the specification as a result of adding the algorithm but ultimately comes to meet the specification as a result of the improvements made using the technique of this example. Thus, in this example, it is confirmed that the design is altered by altering the requirement specification and a different design result is output accordingly. Particularly, this example proves that the technique of this example can alter the design flexibly for any alteration made to the installed algorithm or the specification.

With the design technique of this example, it is possible not only to optimally design the optical circuits and the electronic circuits but also the entire optoelectronic circuit in terms of arrangement of devices, electric wiring and configuration of optical connections in a relatively short period of time. Additionally, if the design operation is suspended on the way for some urgent reason, the design technique of this example can output the best result at that time. Still additionally, in this example, the operation of electronic circuit layout design provided an excellent design result if a computer program that imposes a relatively light load (a computer program whose program execution time is relatively short) is used.

Furthermore, the optoelectronic circuit designed in this way is adapted to maximize the performance of the hardware as shown in FIGS. 5A, 5B and 6 to provide a high cost performance effect. While an optoelectronic circuit having flexible optical circuits provides the advantage of a high degree of freedom of optical connections, it accompanies difficulties for optimum design because of the wide choice due to the high degree of freedom. However, a satisfactory design can be achieved by using the above-described design technique.

Meanwhile, FPGAs were used as reconfigurable electronic circuits in this example. However, the present invention is by no means limited thereto. A reconfigurable electronic circuit is required only to comprise logical elements 201 whose logical feature is alterable and an electric connection network that can alter the interconnections of the logical elements 201 as shown in FIG. 5B. Examples of logical elements 201 typically include LUTs (lookup tables), each having an input/output truth table for the logical function to be realized in a RAM and being adapted to produce an output signal for a combination of inputs. Alternatively, they may be realized by using ANDs, NANDs, ORs, NORs, XORs, flip-flops, latches, registers, inverters, multipliers and/or circuits of combinations of any of these, or they may have memories. Still alternatively, they may be realized by using operating units (processors) for arithmetic operations of integers, floating-points and/or functions.

The electric connection network is used to define the connections among the logical elements. For example, it may be formed by electric wires arranged in the form of matrix and switches in order to interconnect the logical elements that are also arranged in the form of matrix (see FIG. 5B). The switches are arranged at the connections of the logical elements and the electric wires or at the intersections of the wires arranged in the form of matrix. While the reconfigurable system of this example is formed by using only FPGAs, chips of ASICs, CPUs, DSPs and/or memories may alternatively be used. Then, it is possible to provide optical ports for the chips of ASICs and so on.

EXAMPLE 7

Example 7 relates to a design method for a custom optoelectronic circuit. The hardware is fixed in Example 6. More specifically, a predefined reconfigurable system of an optoelectronic circuit having nine FPGAs and nine optical ports is optimally designed in Example 6. The configuration of the electronic circuit layer including the positions of the FPGAs and the electric wires interconnecting the FPGAs and the configuration of the optical connection layer including the number and the positions of optical ports are also predefined in Example 6.

On the other hand, the system of Example 7 has an ASIC (custom chip) as hardware and the rest is realized by FPGAs and memories. While the basic structure of optoelectronic circuit as shown in FIG. 6 is used in this example as in the case of Example 6, the use of a single custom chip is a sole major restriction in this example. Other hardware restrictions include that the maximum number of FPGA chips is four, the maximum number of electric wiring layers is ten, the number of optical connection layers is one and the maximum number of optical ports is sixteen.

Thus, while the positions of FPGAs are fixed in Example 6, the arrangement of the ASIC and the FPGAs are also design elements in this example. Additionally, while the positions and the types of optical ports, the configurations of the optical connection layers including the optical transmission medium are predefined in Example 6, they can be designed within the scope of restrictions in this example.

The sequence of design operation of this example is substantially the same as that of Example 6. The difference will be mainly described below. The sequence down to the step of outputting a net list 10 of the gate level by way of system design and logical design is same as in Example 6. However, since the design of the ASIC is already completed, it is handled as a fixed block and the internal circuit thereof is also fixed. As for the insides of the FPGAs, a feature specification is assigned to each chip and the arrangement and the electric wiring of electronic circuits are designed in advance.

Then, an operation of optoelectronic layout design 11 is conducted. Since the design of the inside of each chip is completed in this example, only the arrangement of the chips and the interconnections of the chips are designed. As in the case of Example 6, the sequence of the electronic circuit layout design 18, the design evaluation 25, the assignment of optical connections 13 and the optical design 14 are repeated.

Firstly the technique same as that of Example 6 is used for the step of electronic circuit layout design 18. An objective function as shown below is defined to judge the design quality in the design evaluation step.

objective function=operation speed/(power consumption rate*circuit area)

Figure 17:
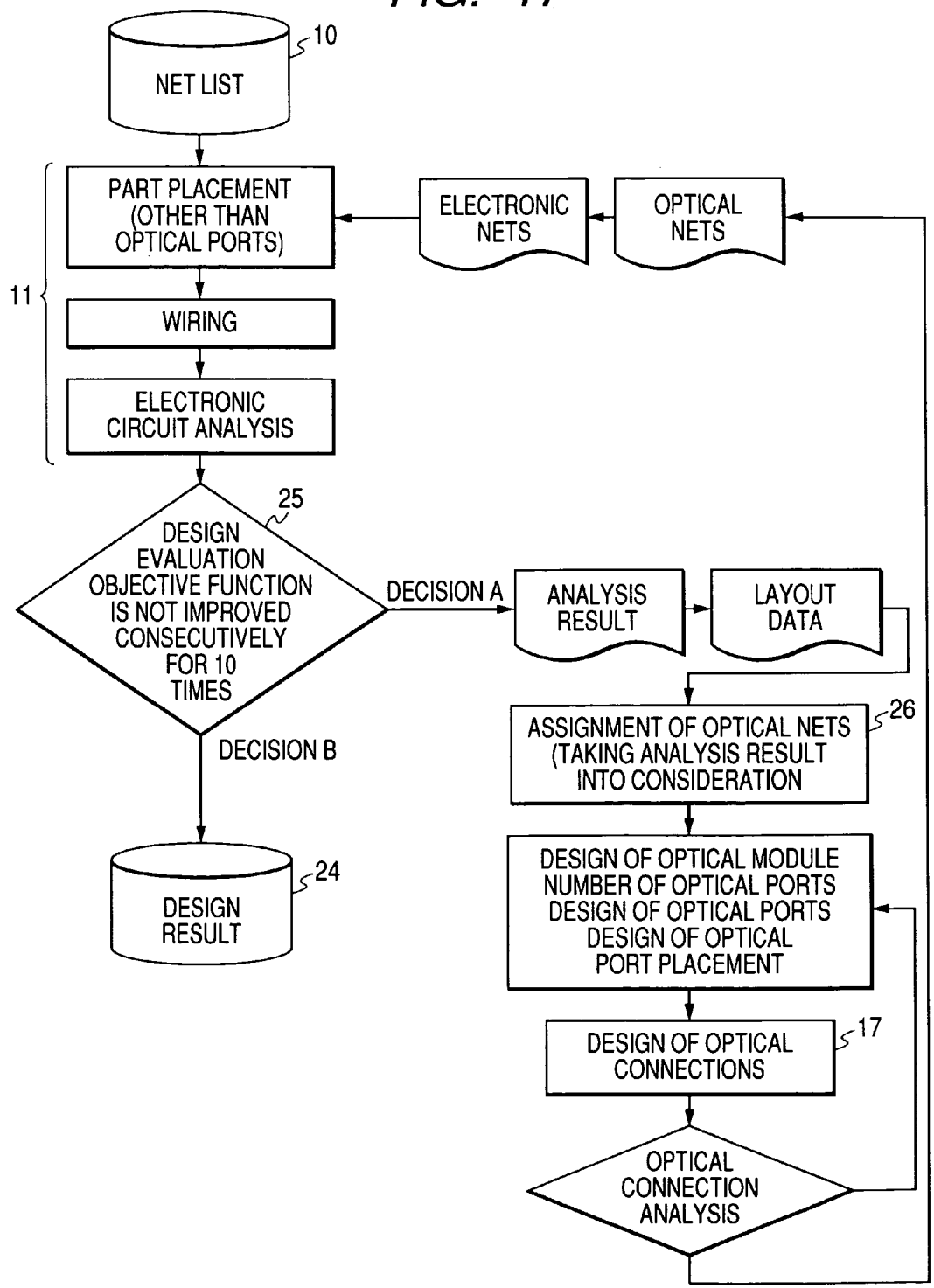
FIG. 17 is a flow chart for designing an optoelectronic circuit of Example 7 (optoelectronic layout section)

As shown in FIG. 17, the value of the objective function is preserved at the first evaluation before decision A. At the second and subsequent evaluations, decision B is made and layout information is output to terminate the design operation if the objective function is not improved consecutively for ten times. Otherwise, decision A is made to proceed with the sequence of optical connections in order to achieve an improvement for the design.

As for the assignment of optical connections, the assignment technique is changed depending on the design evaluation of the immediately preceding design evaluation step. If the value of the objective function is found to show an increase in the design evaluation step from the value of the immediately preceding design evaluation step, optical nets are newly added. If, on the other hand, the value of the objective function is found to show a decrease from the value of the immediately preceding design evaluation step, the nets assigned last time are omitted and other nets are tried to be connected to light. The net showing the largest wiring delay is assigned to an optical connection with priority by referring to the outcome of the last evaluation (including the outcome of the electric wiring delay).

Then, an operation of design and analysis of optical connections is conducted. In this example, the configuration of the optical connection layer is not predetermined and hence the design includes that of the configuration. More specifically, the configuration of the waveguide layer, the number of optical ports, the configuration of optical ports and the placement of optical ports are designed as shown in FIG. 17. As for the configuration of optical ports, a library that stores variations of the configuration shown in FIGS. 12A through 12C in terms of the number of light emitting elements and the structure of the light scattering body is prepared for selection.

The operation of optical connection analysis is same as that of Example 6. However, since the design of the optical connection layer covers a wide scope in this example, the operation of design and analysis of optical connections is repeated for a number of times in order to optimize the design of the optical connection layer with regard to the assignment of optical nets and achieve an improvement.

Figure 19A:
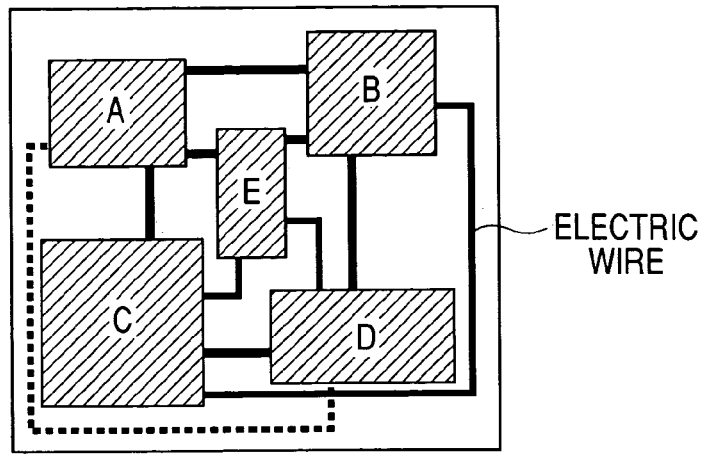
FIGS. 19A, 19B and 19C are schematic illustrations of the design improving effect of Example 7.
Figure 19B:
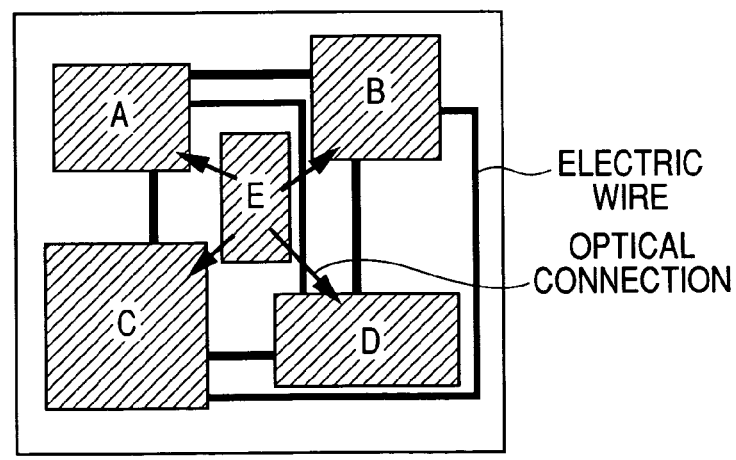
Figure 19C:
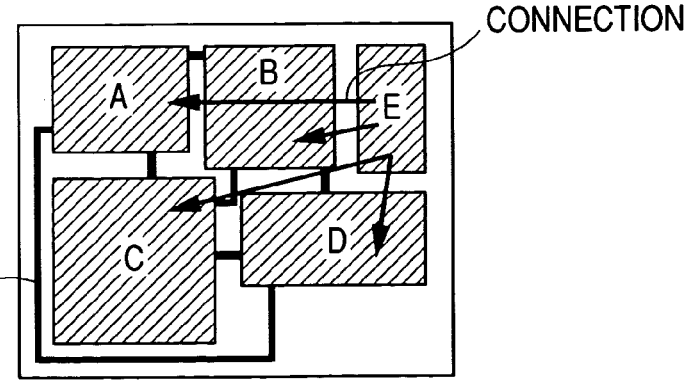
Figure 20:
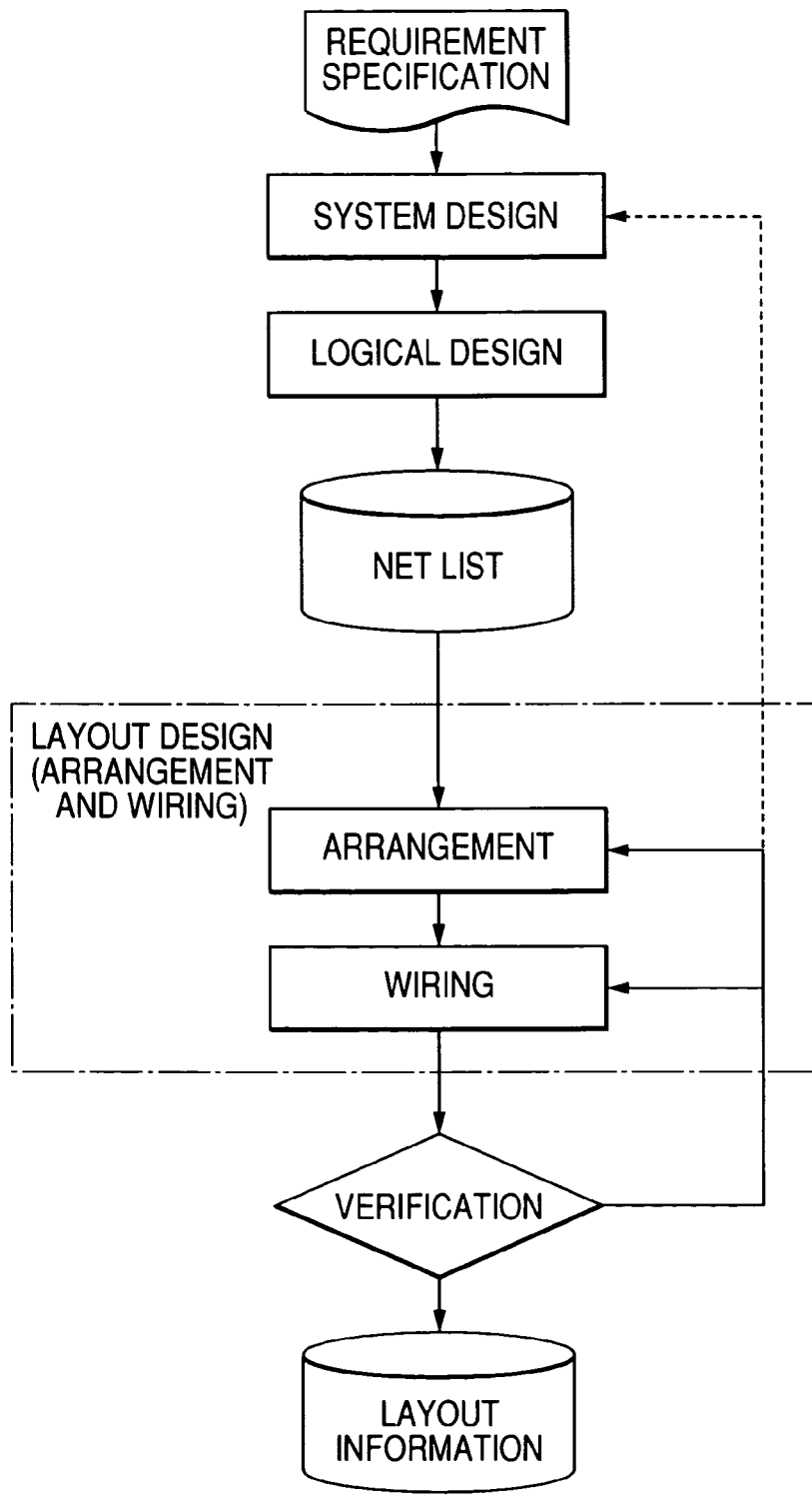
FIG. 20 is a flow chart of a conventional method of designing an integrated circuit.

FIGS. 19A, 19B and 19C are schematic illustrations of the design improving effect of Example 7, showing how the design result changes. In FIGS. 19A through 19C, reference symbols A through E denote semiconductor chips. In this example, A and D denote custom chips and B, C and E denote but not limited to FPGAs. Note that the illustrations just show an example and a similar effect can be expected if the number and the type of chips differ from the illustrations. While FIGS. 19A through 19C show a single electric wiring layer for the purpose of simplicity of description and easy understanding of the effect of the arrangement, there are actually eight electric wiring layers. The total number of electric wiring layers and that of optical connection layers is not limited to the illustrated one.

FIG. 19A shows the result obtained after the end of the first operation of the step of electronic circuit layout design. The electric wiring operation for connecting A and D as indicated by a dotted line is not successful. Additionally, the wiring between B and C shows a large delay and cannot raise the speed as a whole. Therefore, the illustrated arrangement is not satisfactory for the specification.

FIG. 19B shows the outcome of the operation of redesigning only the wiring conducted as the second operation of the step of electronic circuit layout design after the end of the first operation of assigning and designing optical connections. The arrowed lines are assigned to optical connections. As a result, it becomes possible to connect A and D by electric wiring.

FIG. 19C shows the outcome of the operation of altering the design for the placement of devices. It will be seen that the circuit area is reduced as a result. The electric wire connecting B and C can be made shorter to raise the operation speed of the circuit.

By conducting the operation of electric circuit layout design after assigning optical connections in this way, it is possible not only to improve the performance as a result of replacing part of the electric wires by optical connections but also to optimally alter the placement of devices due to optical connections. Thus, it will be seen that the optoelectronic circuit is optimized as a whole.

With the design technique of this example, it is possible not only to optimally design the optical circuits and the electronic circuits but also the entire optoelectronic circuit in terms of arrangement of devices, electric wiring and configuration of optical connections in a relatively short period of time. Additionally, if the design operation is suspended on the way for some urgent reason, the design technique of this example can output the best result at that time.

EXAMPLE 8

Hardware of the type illustrated in FIGS. 9A and 9B is used in Example 8. Referring to FIGS. 9A and 9B, there are shown a substrate 100, an optical transmission medium 101, optical ports 102, light 103 being transmitted, an electric wiring layer 105 and semiconductor chips 107 (107a through 107c) (while electric wiring layer 105 contains electric wires, they are not shown). In FIGS. 9A and 9B, reference symbols 107a, 107b, 107c denote FPGAs and reference symbol 107d denotes a custom chip. FIG. 9A is a plan view and FIG. 9B is a cross sectional view that corresponds to FIG. 9A.

In this example, the optical module having an optical transmission medium 101 and optical ports 102 is arranged in an area of a part of the substrate and semiconductor chips 107 are arranged in the remaining area. As restriction, the optical module is handled as part and no semiconductor chip can be arranged there. Since an electric wiring layer is provided separately, electric wires can be arranged in intraplanar positions of the optical module. Other major restrictions for the hardware include that the number of FPGA chips is three, the number of custom chips is one, the number of electric wiring layer is four, the size of the optical transmission medium is 1 cm square, the number of optical connection layers is one and the maximum number of optical ports is 10 (see FIG. 9A for the placement of optical ports). Optical ports are arranged along the edges of the optical transmission medium.

In this example, the internal circuits of the FPGA 107a, 107b, 107c, the electric wiring among the semiconductor chips 107 and the optical connections among the semiconductor chips 107 are designed. The design technique is similar to that of Example 7. However, this example is characterized in that the surface profile, the size and the position of the optical transmission medium are design items in the step of optical connection design (optical module design) and the position of the optical module is a design item in the step of designing the arrangement of electronic circuits. Particularly, the design of the profile of the optical module significantly influences the layout of the semiconductor chips.

In this example, the first operation of electronic circuit layout design (only electric wiring is used) does not meet the specification but it is possible to ultimately meet the specification by arranging when an optical module at the center as shown in FIG. 9A. By conducting the operation of optical connection design and electric circuit layout design after assigning optical connections in this way, it is possible not only to improve the performance as a result of replacing part of the electric wires by optical connections but also to optimally alter the placement of devices due to the design of the optical module and the like. Thus, it will be seen that the optoelectronic circuit is optimized as a whole.

With the design technique of this example, it is possible not only to optimally design the optical circuits and the electronic circuits but also the entire optoelectronic circuit in terms of arrangement of devices, electric wiring and configuration of optical connections in a relatively short period of time. Additionally, if the design operation is suspended on the way for some urgent reason, the design technique of this example can output the best result at that time.

EXAMPLE 9

An optoelectronic system that can be reconfigured on a real time basis (optoelectronic reconfiguration system) is designed in Example 9. FIGS. 10A and 10B are schematic illustrations of the reconfigurable optoelectronic system of this example. It comprises a circuit (device) 92 for designing an optoelectronic circuit, a reconfigurable optoelectronic circuit 91, a configuration memory 93 and I/O (input/output means) 94.

The circuit 92 for designing an optoelectronic circuit has means as illustrated in FIG. 18 and operates in a manner as described earlier. In this example, these means are integrated into a single chip and installed as hardware.

In the reconfigurable optoelectronic system of this example, the circuit 92 for designing an optoelectronic circuit generates design data (or alters them) on the basis of the input data from I/O 94 and stores the design data in the configuration memory 93. The reconfigurable optoelectronic circuit 91 sequentially reads design data from the configuration memory 93 and reconfigures itself (alters the internal configuration thereof). The output from the reconfigurable optoelectronic circuit 91 is sent to the I/O 94. In this way, it is possible to optimize the internal configuration of the optoelectronic circuit 91 at any time on the basis of the input data from the I/O 94.

In this example, it is possible to design an optoelectronic circuit 91, integrating optical circuits and electric circuits, with a high degree of wiring freedom and it is also possible to reconfigure the optoelectronic circuit 91 on a real time basis. In other words, the system of this example can operate as a dynamic reconfigurable system that can freely alter the internal configuration of the optoelectronic circuit 91 on a real time basis.

Since the reconfigurable system of this example can optimally design a reconfigurable optoelectronic circuit 91 and reconfigure it in a short period of time in a system that requires reconfiguration of hardware at any time in response to the continuous change in the operating environment, it can suitably be used in a control system such as the control system of a robot. Particularly, since the design is improved repeatedly, the system can quickly and flexibly adapt itself to any continuous change in the operating environment.

While this example is described above by referring to FIG. 10A that illustrates the mutually connected components of the system, it is also possible to configure the system in such a way that the components are connected by a bus 95 as shown in FIG. 10B. The function of the memory 93 may be carried by the reconfigurable optoelectronic circuit 91 or the circuit 92 for designing the optoelectronic circuit.

EXAMPLE 10

In Example 10, a reconfigurable optoelectronic circuit is used for designing an optoelectronic circuit in which circuits are fixed. The designed circuit is verified and evaluated by means of the reconfigurable optoelectronic circuit used in Example 6 and a custom optoelectronic circuit is prepared on the basis of the output result.

FIG. 14 is a schematic illustration of a design evaluation device for designing and evaluating the optoelectronic circuit of this example. The design evaluation device comprises a design means 82 for designing an optoelectronic circuit and a design evaluation means 87 for installing the design result of the design means 82 in a reconfigurable optoelectronic circuit 91, operating it and evaluating the design result. In other words, the design evaluation device of this example comprises a design evaluation means 87 in addition to the device for designing an optoelectronic circuit (FIG. 18) that is used in Example 6. In this example, hardware similar to that of Example 6 is used for the reconfigurable optoelectronic circuit 91.

The performance of the reconfigurable optoelectronic circuit 91 is compared and its functions are verified by installing a plurality of design results output from the design means 82 of this design evaluation device in the reconfigurable optoelectronic circuit 91 and operating it. The design result that provides the most preferable performance is selected by referring to the requirement specification. It is referred to as the first design result. The design result that shows the largest value of (operation frequency)/(power consumption rate) is adopted in this example.

An operation of optoelectronic layout design is conducted once again, using the electric nets and the optical nets that produced the first design result and according to a different custom specification. Main restriction items include that electric nets are realized by an electric wiring layer and ASICs, or cell-based custom ICs. The physical specification of the electric wiring layer is same as that of the reconfigurable optoelectronic circuit 91. While the optical connection layer has a configuration similar to that of the reconfigurable optoelectronic circuit 91, optical ports may be arranged arbitrarily.

The technique for the second optoelectronic layout design is similar to the technique used in Example 7. However, the insides of the ASICs are designed in the step of electronic circuit layout design in this example. Additionally, the circuit realized by a plurality of FPGAs may be installed in a single ASIC. The substrate is square but its size is a design item. The substrate size is defined to be as small as possible on the basis of the electronic circuit layout design. As a result, the placement of optical ports is dimensionally reduced, while maintaining their positional relationship. The result obtained in this stage is referred to as the second design result.

A new mask for ASICs, the electric wiring layer and optical connection layer is formed on the basis of the second design result and a custom optoelectronic circuit is prepared.

While the reconfigurable optoelectronic circuit 91 can alter its circuit configuration, the configuration of the custom optoelectronic circuit is fixed. On the other hand, the custom optoelectronic circuit of this example can retrench the hardware such as the electric wires, the optical ports and the light emitting sections that have not been used if compared with the reconfigurable optoelectronic circuit 91 realized on the basis of the first design result so that it is possible to remarkably reduce the circuit area. Additionally, the internal configuration of each optical port such as the configuration of the optical coupling section and the arrangement and the number of the light emitting sections can be optimized in each optical port to improve the performance and reduce the dimensions of the circuit. This leads to an improved performance including an increase in the operation frequency and a reduction in the power consumption rate.

Thus, in this example, it is possible to realize a highly reliable high performance optoelectronic circuit by designing a custom optoelectronic circuit, using a reconfigurable optoelectronic circuit 91 as emulator. The method of designing an optoelectronic circuit of this example is more reliable than the design method that uses only simulation for verification. Particularly, when the circuit has large dimensions, it can curtail the design time and reduce the design cost.

This application claims priority from Japanese Patent Application Nos. 2003-415823 filed Dec. 15, 2003 and 2003-415826 filed Dec. 15, 2003, which are hereby incorporated by reference herein.

What is claimed is:

1. A method of designing a circuit having electric wires and optical connections, said method comprising at least:
 a first step of generating a circuit connection list;
 a second step of generating a list of connections to be carried by electronic circuits that are referred to as electric nets and a list of connections to be carried by optical connections that are referred to as optical nets from the circuit connection list;
 a third step of designing placements of parts and electric wiring according to the electric nets; and
 a fourth step of designing optical connections according to the optical nets, wherein
 said circuit having electric wires and optical connections has a package structure including a plurality of semiconductor chips, an electric wiring layer and an optical connection layer, and at least two of the semiconductor chips are optically interconnected by way of the optical connection layer, and
 said semiconductor chips have reconfigurable circuits so that it is possible to alter the internal configurations of the semiconductor chips and additionally alter the optical connections among the semiconductor chips by way of said optical connection layer.

2. The method according to claim 1, further comprising:
 a fifth step of placing optical ports, that are parts having a photoelectric conversion feature, after said second step and before said third and fourth steps.

3. The method according to claim 2, wherein the optical ports are placed in said fifth step so as to minimize the total length of electric wires.

4. The method according to claim 1, wherein the electric nets and the optical nets are generated in said second step so as to minimize the number of electric nets.

5. The method according to claim 1, further comprising:
 a fifth step of verifying the design of placements of parts and electric wiring in said third step and the design of optical connections in said fourth step and determining either to end the design operation or to return to one of said second through fourth steps.

6. A device for designing a circuit having electric wires and optical connections, said device comprising at least:
 first means for generating an electronic circuit connection list and an optical connection list from a circuit connection list;
 second means for storing the circuit connection list, the electronic circuit connection list and the optical connection list;
 third means for designing a layout for electronic circuits according to the electronic circuit connection list; and
 fourth means for designing optical connections according to the optical connection list, wherein
 said circuit having electric wires and optical connections has a package structure including a plurality of semiconductor chips, an electric wiring layer and an optical connection layer, and at least two of the semiconductor chips are optically interconnected by way of the optical connection layer, and
 said semiconductor chips have reconfigurable circuits so that it is possible to alter the internal configurations of the semiconductor chips and additionally alter the optical connections among the semiconductor chips by way of said optical connection layer.

7. A method of reconfiguring a circuit having electric wires, optical connections, and reconfigurable circuit, the method comprising:
 performing a design operation by means of the design device of claim 6 according to input information; and
 installing an outcome of the design operation in the reconfigurable circuit.

8. A method of evaluating a design of a circuit having electric wires, optical connections, and a reconfigurable circuit, the method comprising:
 installing an outcome of the design device of claim 6 in the reconfigurable circuit; and
 evaluating the design through operation of the circuit.

9. A computer program, stored on a computer-readable medium, for designing a circuit having electric wires and optical connections, said program being adapted to drive a computer so as to execute at least:
 a first step of generating an electronic circuit connection list and an optical connection list from a circuit connection list;
 a second step of designing a layout for electronic circuits according to the electronic circuit connection list; and
 a third step of designing optical connections according to the optical connection list, wherein
 said circuit having electric wires and optical connections has a package structure including a plurality of semiconductor chips, an electric wiring layer and an optical connection layer, and at least two of the semiconductor chips are optically interconnected by way of the optical connection layer; and
 said semiconductor chips have reconfigurable circuits so that it is possible to alter the internal configurations of the semiconductor chips and additionally alter the optical connections among the semiconductor chips by way of said optical connection layer.

10. A method of designing a circuit having electric wires and optical connections, said method comprising at least:
 a first step of generating a circuit connection list;
 a second step of designing a layout for electronic circuits according to the circuit connection list;
 a third step of generating an optical connection list constituted by a part of the circuit connection list and an electronic circuit connection list constituted by the remaining part of the circuit connection list;

a fourth step of designing optical connections according to the optical connection list;

a fifth step of designing a layout of electronic circuits according to the electronic circuit connection list; and a sixth step of performing a design evaluation of the layout design of electronic circuits of said second step or a design evaluation of the design of said fourth step and the design of said fifth step and determining either to proceed to said third step or end the design, wherein said circuit having electric wires and optical connections has a package structure including a plurality of semiconductor chips, an electric wiring layer and an optical connection layer, and at least two of the semiconductor chips are optically interconnected by way of the optical connection layer, and said semiconductor chips have reconfigurable circuits so that it is possible to alter the internal configurations of the semiconductor chips and additionally alter the optical connections among the semiconductor chips by way of said optical connection layer.

11. The method according to claim 10, wherein said third, fourth, fifth and sixth steps are repeated for more than once.

12. The method according to claim 10, wherein new electronic circuits are added to connecting sections of the optical connections and the electronic circuits and a connection list corresponding to the new electronic circuits is added to the electronic circuit connection list in the fourth step.

13. A device for designing a circuit having electric wires and optical connections, said device comprising at least:

first means for storing a circuit connection list;

second means for designing a layout for electronic circuits according to the circuit connection list;

third means for generating an optical connection list constituted by a part of the circuit connection list and an electronic circuit connection list constituted by the remaining part of the circuit connection list;

fourth means for designing optical connections according to the optical connection list;

fifth means for evaluating the layout design of electronic circuits by said second means and the design by said fourth means; and control means for controlling the sequence of operations of said first through fifth means, wherein said circuit having electric wires and optical connections has a package structure including a plurality of semiconductor chips, an electric wiring layer and an optical connection layer, and at least two of the semiconductor chips are optically interconnected by way of the optical connection layer; and said semiconductor chips have reconfigurable circuits so that it is possible to alter the internal configurations of the semiconductor chips and additionally alter the optical connections among the semiconductor chips by way of said optical connection layer.

14. A method of reconfiguring a circuit having electric wires, optical connections, and a reconfigurable circuit, the method comprising:

performing a design operation by means of the design device of claim 13 according to input information; and installing an outcome of the design operation in the reconfigurable circuit.

15. A method of evaluating a design of a circuit having electric wires, optical connections, and a reconfigurable circuit, the method comprising:

installing an outcome of the design device of claim 13 in the reconfigurable circuit; and evaluating the design through operation of the circuit.

16. A computer program, stored on a computer-readable medium, for designing a circuit having electric wires and optical connections, said program being adapted to drive a computer so as to execute at least:

a step of designing a layout for electronic circuits according to a circuit connection list;

a branching step of evaluating the design, and selecting the next step to be carried out according to an outcome of the design evaluation;

a step of generating an optical connection list constituted by a part of the circuit connection list and an electronic circuit connection list constituted by the remaining part of the circuit connection list; and a step of designing optical connections according to the optical connection list, wherein said circuit having electric wires and optical connections has a package structure including a plurality of semiconductor chips, an electric wiring layer and an optical connection layer, and at least two of the semiconductor chips are optically interconnected by way of the optical connection layer; and said semiconductor chips have reconfigurable circuits so that it is possible to alter the internal configurations of the semiconductor chips and additionally alter the optical connections among the semiconductor chips by way of said optical connection layer.

* * * * *

UNITED STATES PATENT AND TRADEMARK OFFICE
CERTIFICATE OF CORRECTION

PATENT NO. : 7,248,757 B2
APPLICATION NO. : 11/010381
DATED : July 24, 2007
INVENTOR(S) : Iwasaki It is certified that error appears in the above-identified patent and that said Letters Patent is hereby corrected as shown below:

TITLE PAGE:
    (56) Other Publications, After U.S. Appl. No. 10/533,564: "Jun. 3, 2005." should read -- May 3, 2005. --.

COLUMN 1:
    Line 18, "be" should read -- being --.

COLUMN 8:
    Line 22, "word," should read -- words, --; and
    Line 27, "tools." should read -- tool. --.

COLUMN 9:
    Line 64, "much" should read -- many --.

COLUMN 10:
    Line 13, "illustrate" should read -- illustrates --.

COLUMN 12:
    Line 3, "shorts," should read -- short, --.

COLUMN 14:
    Line 10, "in to" should read -- into --.

COLUMN 15:
    Line 32, "B;" should read -- B: --; and
    Line 33, "step)" should read -- step). --.

COLUMN 18:
    Line 49, "thousands" should read -- thousand --.

COLUMN 19:
    Line 31, "inter-EPGA" should read -- inter-FPGA --.

COLUMN 21:
    Line 35, "receive" should read -- receives --.

UNITED STATES PATENT AND TRADEMARK OFFICE
CERTIFICATE OF CORRECTION

PATENT NO.          : 7,248,757 B2
APPLICATION NO. : 11/010381
DATED                   : July 24, 2007
INVENTOR(S)        : Iwasaki It is certified that error appears in the above-identified patent and that said Letters Patent is hereby corrected as shown below:

COLUMN 23:
       Line 9, "tools." should read -- tool. --.

COLUMN 25:
       Line 7, "preferably" should read -- preferable --.

COLUMN 26:
       Line 23, "preferably" should read -- preferable --.

COLUMN 33:
       Line 25, "shows" should read -- show --; and
       Line 38, "thousands" should read -- thousand --.

COLUMN 36:
       Line 23, "receive" should read -- receives --.

COLUMN 38:
       Line 38, "criterion;" should read -- criterion: --; and
       Line 65, "connections" should read -- connections. --.

COLUMN 39:
       Line 20, "assigne" should read -- assigned --;
       Line 20, "connectioned" should read -- connections --; and
       Line 20, "problem." should read -- problems. --.

COLUMN 40:
       Line 37, "had," should read -- hand, --.

COLUMN 48:
       Line 27 claim 7, "reconfigurable" should read -- a reconfigurable --; and
       Line 55 claim 9, "layer; and" should read -- layer, and --.

UNITED STATES PATENT AND TRADEMARK OFFICE
CERTIFICATE OF CORRECTION

PATENT NO.         : 7,248,757 B2
APPLICATION NO.    : 11/010381
DATED              : July 24, 2007
INVENTOR(S)        : Iwasaki It is certified that error appears in the above-identified patent and that said Letters Patent is hereby corrected as shown below:

COLUMN 50:
  Line 3, "layer; and" should read -- layer, and --; and
  Line 42, "layer; and" should read -- layer, and --.

Signed and Sealed this

Second Day of December, 2008

JON W. DUDAS
*Director of the United States Patent and Trademark Office*